US012813274B2

(12) United States Patent
Ku et al.

(10) Patent No.: US 12,813,274 B2
(45) Date of Patent: *Nov. 24, 2026

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Shih-Chang Ku, Taipei City (TW); Hung-Chi Li, Taipei City (TW); Tsung-Shu Lin, New Taipei City (TW); Tsung-Yu Chen, Hsinchu (TW); Wensen Hung, Zhubei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/153,532

(22) Filed: Jan. 12, 2023

(65) Prior Publication Data

US 2023/0144244 A1 May 11, 2023

Related U.S. Application Data

(60) Continuation of application No. 17/228,018, filed on Apr. 12, 2021, now Pat. No. 11,594,469, which is a division of application No. 16/290,557, filed on Mar. 1, 2019, now Pat. No. 10,978,373.

(60) Provisional application No. 62/687,112, filed on Jun. 19, 2018.

(51) Int. Cl.
*H10W 40/73* (2026.01)
*H10W 40/00* (2026.01)
*H10W 90/00* (2026.01)

(52) U.S. Cl.
CPC ......... *H10W 40/73* (2026.01); *H10W 40/037* (2026.01); *H10W 90/00* (2026.01)

(58) Field of Classification Search
None
See application file for complete search history.

(56) References Cited

U.S. PATENT DOCUMENTS

| | | | | |
|---|---|---|---|---|
| 8,993,380 | B2 | 3/2015 | Hou et al. | |
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 10,978,373 | B2 * | 4/2021 | Ku | H01L 24/24 |

(Continued)

*Primary Examiner* — Hung K Vu
(74) *Attorney, Agent, or Firm* — Slater Matsil, LLP

(57) ABSTRACT

A semiconductor device includes a vapor chamber lid for high power applications such as chip-on-wafer-on-substrate (CoWoS) applications using high performance processors (e.g., graphics processing unit (GPU)) and methods of manufacturing the same. The vapor chamber lid provides a thermal solution which enhances the thermal performance of a package with multiple chips. The vapor chamber lid improves hot spot dissipation in high performance chips, for example, at the three-dimensional (3D-IC) packaging level.

20 Claims, 14 Drawing Sheets

(56) References Cited

U.S. PATENT DOCUMENTS

| | | | | |
|---|---|---|---|---|
| 2005/0274487 | A1 | 12/2005 | Goth | |
| 2011/0042784 | A1* | 2/2011 | Edwards | H01L 23/293 257/532 |
| 2018/0308783 | A1* | 10/2018 | Refai-Ahmed | H01L 23/373 |
| 2019/0348345 | A1* | 11/2019 | Parida | H01L 25/18 |

* cited by examiner

SEMICONDUCTOR DEVICE AND METHOD OF MANUFACTURE

PRIORITY CLAIM AND CROSS-REFERENCE

This application is a continuation of U.S. patent application Ser. No. 17/228,018 filed on Apr. 12, 2021, entitled “Semiconductor Device and Method of Manufacture,” which is a divisional of U.S. patent application Ser. No. 16/290,557 filed on Mar. 1, 2019, entitled “Semiconductor Device and Method of Manufacture,” now U.S. Pat. No. 10,978,373, issued on Apr. 13, 2021, which claims the benefit of U.S. Provisional Application No. 62/687,112, filed on Jun. 19, 2018, which applications are hereby incorporated herein by reference.

BACKGROUND

A typical problem with three-dimensional integrated circuits is heat dissipation during operation. A prolonged exposure of a die by operating at excessive temperatures may decrease the reliability and operating lifetime of the die. This problem may become severe if the die is a computing die such as a central processing unit (CPU), which generates a lot of heat. As such, improvements to heat transfer are still needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 1A:
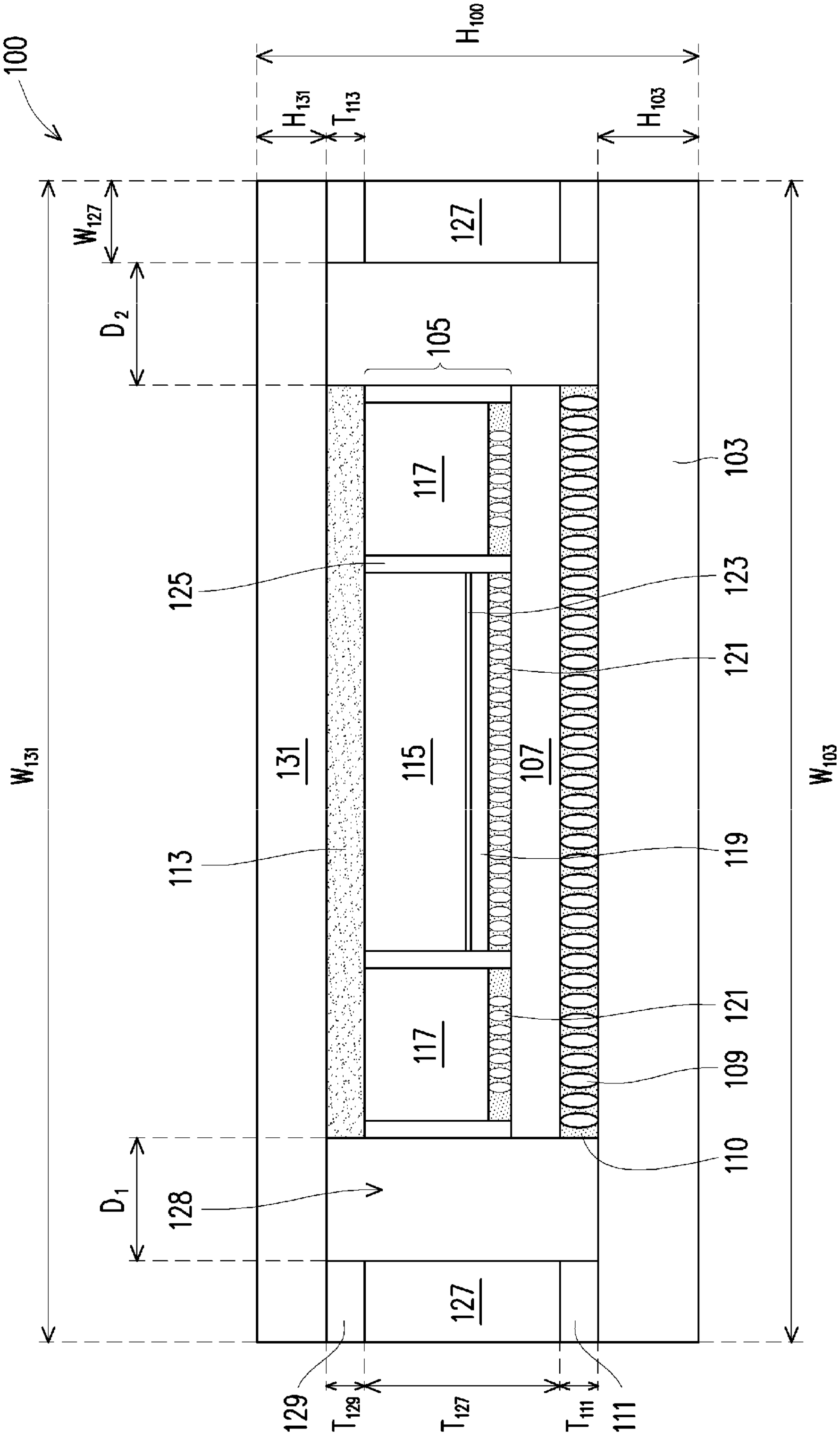
FIG. 1A illustrates a semiconductor device comprising a 3D-IC package including a vapor chamber lid (VC-Lid) in accordance with an embodiment.

Corresponding numerals and symbols in the different figures generally refer to corresponding parts unless otherwise indicated. The figures are drawn to clearly illustrate the relevant aspects of the embodiments and are not necessarily drawn to scale. Furthermore, dashed outlines depict regions where a layer or a component of the package is beneath or behind another layer or component.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Three-dimensional integrated circuits (3D-ICs) offer many solutions to reducing physical sizes of packaged components and allowing for a greater number of components to be placed in a given chip area. One solution that 3D-IC components offer is to stack dies on top of one another and interconnect or route them through connections such as through-silicon vias (TSVs). Some of the benefits of 3D-IC, for example, include exhibiting a smaller footprint, reducing power consumption by reducing the lengths of signal interconnects, and improving yield and fabrication cost if individual dies are tested separately prior to assembly. One challenge with 3D-IC components is dealing with heat dissipation and managing thermal hotspots during operation.

Embodiments described herein relate to a semiconductor device including a vapor chamber lid (VC-Lid) for high power applications such as chip-on-wafer-on-substrate (CoWoS) applications using high performance processors (e.g., graphics processing unit (GPU)) and methods of manufacturing the same. In an embodiment, a thermal solution enhances the CoWoS thermal performance of a package with multiple chips. In an embodiment, heat dissipation is improved in 3D-IC packaging including high performance multiple chip stacking techniques with high power densities of the stacked chips being between about 50 $W/cm^2$ and about 300 $W/cm^2$, and hot spot dissipation may be achieved in high performance chip packages including, for example, at the three-dimensional integrated circuit package (3D-IC PKG) level.

In some embodiments, an increase in lid thermal spreading effects, and a reduction of package thermal resistance, may be achieved in various technologies (e.g., VC-Lid on chip-on-wafer (CoW), VC-Lid with copper (Cu)-Sheet, Embedded VC-Lid). Designs of some embodiments may be adaptive and provide for easy implementation that is compatible with other existing thermal solution supply chains.

With reference now to FIG. 1A, this figure illustrates a semiconductor device 100 that comprises a 3D-IC PKG substrate 103, which is bonded to a first side of a 3D-IC module 105. The 3D-IC PKG substrate 103 may be coupled both electrically and physically to another substrate on a side of the 3D-IC PKG substrate 103 opposite the 3D-IC module 105. Another substrate may provide a structural base and an electrical interface from the 3D-IC PKG substrate 103 and/or the 3D-IC module 105 to other devices and systems. In some embodiments, the 3D-IC PKG substrate 103 may be bonded to another substrate, such as, a printed circuit board that works to interconnect various electrical components to each other in order to provide a desired functionality for a user. In other embodiments, the 3D-IC PKG substrate 103 may be bonded to another substrate, such as, a redistribution layer that comprises multiple conductive layers, some of which are inter-layers within the other substrate. In some embodiments, the 3D-IC PKG substrate 103 may be bonded to another substrate, such as, a substrate including electrical elements, such as resistors, capacitors, signal distribution circuitry, combinations of these, or the like. These electrical elements may be active, passive, or a combination thereof. In other embodiments, the 3D-IC PKG substrate 103 may be bonded to a substrate that is free from both active and passive electrical elements therein. All such combinations are fully intended to be included within the scope of the embodiments.

In an embodiment the 3D-IC PKG substrate 103 may be a mother substrate and may comprise a first semiconductor die such as a logic die/interposer that comprises a number of structures such as a substrate formed from a variety of semiconductor substrate materials such as silicon (Si), silicon carbide (SiC), gallium arsenide (GaAs), gallium nitride (GaN), or the like. A combination of active and/or passive devices, such as transistors, diodes, resistors, capacitors, and the like, may be formed as part of the 3D-IC PKG substrate 103 to construct functional circuitries. In addition, alternating layers of conductive materials (such as copper, aluminum, alloys, doped polysilicon, combinations thereof, or the like) may be utilized between layers of dielectric material to form interconnections between the active and passive devices and also to provide access to external connections of the 3D-IC PKG substrate 103. Through substrate vias (TSVs) may also be formed in order to provide electrical connectivity from one side of the 3D-IC PKG substrate 103 to another side of the 3D-IC PKG substrate 103. In an embodiment, the 3D-IC PKG substrate 103 has a height $H_{103}$ of between about 1 mm and about 3 mm, such as about 1.8 mm and a width $W_{103}$ of between about 30 mm and about 100 mm, such as about 60 mm.

In an embodiment the 3D-IC PKG substrate 103 may be bonded to another substrate using external connections, which may be, e.g., solder balls. External connections of the 3D-IC PKG substrate 103 may provide electrical and thermal connections between the 3D-IC PKG substrate 103 and the substrate to which the 3D-IC PKG substrate 103 is bonded. However, other methods of electrically and physically attaching the 3D-IC PKG substrate 103 to another substrate, such as C4 bumps, micro-bumps, pillars, columns, or other structures formed from a conductive material such as solder, metal, or metal alloy, may be utilized to facilitate electrical, physical, and thermal connectivity between the 3D-IC PKG substrate 103 and the substrate to which the 3D-IC PKG substrate 103 is bonded.

The 3D-IC module 105 may comprise semiconductor stacked dies such as memory, flash, converter, sensor, logic die, interposer and so on that can work in conjunction with the 3D-IC PKG substrate 103 in order to provide a desired functionality to the user. In a particular embodiment the 3D-IC module 105 may be considered a daughter substrate (to the 3D-IC PKG substrate's 103 mother substrate) and comprises a number of structures such as an interposer 107 formed from a variety of semiconductor substrate materials such as silicon (Si), silicon carbide (SiC), gallium arsenide (GaAs), gallium nitride (GaN), or the like. A combination of active and/or passive devices, such as transistors, diodes, resistors, capacitors, and the like, may be formed as part of the interposer 107 to construct functional circuitries. In addition, the interposer 107 may include a series of alternating layers of conductive materials (such as copper, aluminum, alloys, doped polysilicon, combinations thereof, or the like) may be utilized between layers of dielectric material to form interconnections between the active and passive devices and also to provide access to module external connections 109 (e.g., external connections of a 3D-IC module).

In an embodiment the 3D-IC module 105 is bonded to the 3D-IC PKG substrate 103 using the module external connections 109, which may be, e.g., solder balls. The module external connections 109 provide electrical and thermal connections between the 3D-IC module 105 and the 3D-IC PKG substrate 103. However, other methods of electrically and physically attaching the 3D-IC module 105 to the 3D-IC PKG substrate 103, such as C4 bumps, micro-bumps, pillars, columns, or other structures formed from a conductive material such as solder, metal, or metal alloy, may be utilized to facilitate electrical, physical, and thermal connectivity between the 3D-IC module 105 and the 3D-IC PKG substrate 103.

In some embodiments, the 3D-IC module 105 may comprise a plurality of high performance semiconductor dies such as may be used in the processing of 3D smart internet TV graphics or other processing intense applications. As illustrated in FIG. 1A, the 3D-IC module 105 may include a 3D-IC processor 115 (e.g., CPU, graphics processing unit (GPU)), and 3D-IC memory dies 117 (e.g., high bandwidth memory (HBM), memory cubes, memory stacks, or the like) that are separated by an encapsulate 125. In an embodiment, the 3D-IC processor 115 is coupled to the interposer 107 via a 3D-IC logic interface 119 bonded to the 3D-IC processor 115 by way of chip side interface bonds 123. In addition, the 3D-IC logic interface 119 may include a series of alternating layers of conductive materials (such as copper, aluminum, alloys, doped polysilicon, combinations thereof, or the like) to form interconnections between the memory dies 117 and the 3D-IC processor 115 and to provide access to the 3D-IC logic interface 119. The plurality of semiconductor dies of the 3D-IC module 105 may be bonded to the interposer 107 via a plurality of surface side contacts 121. In an embodiment, the surface side contacts 121 may be microbumps.

FIG. 1A also illustrates the application of first thermal interface material (TIM) 111 to a top surface of the 3D-IC PKG substrate 103 and the application of second thermal interface material (TIM) 113 to a top surface of the 3D-IC module 105. In an embodiment the first thermal interface material 111 may be a viscous, silicone compound similar to the mechanical properties of a grease or a gel. The first thermal interface material 111 is used to improve electrical and/or thermal conduction by filling in microscopic air pockets created between minutely uneven surfaces, such as the region between surfaces of the 3D-IC PKG substrate 103 and overlying materials; the first thermal interface 111 may also have a thermal conductivity (i.e., "k value") in Watts per meter-Kelvin (W/mK) of between about 1 W/mK and about 10 W/mK, such as about 4 W/mK, for example.

In some embodiments the first thermal interface material 111 is a metal-based thermal paste containing silver, nickel, or aluminum particles suspended in the silicone grease. In other embodiments non-electrically conductive, ceramic-based pastes, filled with ceramic powders such as beryllium oxide, aluminum nitride, aluminum oxide, or zinc oxide, may be applied. In other embodiments, instead of being a paste with a consistency similar to gels or greases, the first thermal interface material 111 may, instead be a solid material. In this embodiment the first thermal interface material 111 may be a thin sheet of a thermally conductive, solid material. In a particular embodiment the first thermal interface material 111 that is solid may be a thin sheet of indium, nickel, silver, aluminum, combinations and alloys of these, or the like, or other thermally conductive solid material. Any suitably thermally conductive material may also be utilized, and all such materials are fully intended to be included within the scope of the embodiments.

The first thermal interface material 111 is injected or placed on the 3D-IC PKG substrate 103 around but laterally separated from the 3D-IC module 105. In an embodiment the first thermal interface material 111 has a first thickness $T_{111}$ of between about 20 μm and about 200 such as about 60 μm. However, any other suitable thickness may also be used. Additionally, the first thermal interface material 111 may be spaced from the 3D-IC module 105 by a first distance $D_1$ of between about 2 mm and about 20 mm, such as about 2.5 mm.

The second thermal interface material 113 may be applied to a surface of the VC-Lid 131 or a top surface of the 3D-IC module 105 in order to provide a thermal interface between the 3D-IC module 105 and the overlying VC-Lid 131. In an embodiment the second thermal interface material 113 may be similar to the first thermal interface material 111 and may be applied at the same time as the first thermal interface material 111, although the second thermal interface material 113 may also be different from the first thermal interface material 111. In an embodiment the second thermal interface material 113 may be applied in either a solid, grease, or gel consistency or may be applied as a film type TIM, such as a CNT or a graphite based TIM. In some embodiments, the second thermal interface material 113 is formed to a third thickness $T_{113}$ of between about 20 μm and about 200 such as about 60 μm or about 120 um. However, any suitable thickness may be used. According to some embodiments, the second thermal interface material 113 may have a thermal conductivity (i.e., "k value") in Watts per meter-Kelvin (W/mK) of between about 1 W/mK and about 30 W/mK, such as about 4 W/mK, for example. However, any suitable value of thermal conductivity may be used.

FIG. 1A further illustrates a thermally conductive ring 127 on the first thermal interface material 111 may be laterally separated from the 3D-IC module 105 by the first distance $D_1$ and also extend to encircle the 3D-IC module 105 forming a cavity 128 between inner walls of the thermally conductive ring 127. However, any suitable distance may be used. In an embodiment, the lateral separation between the thermally conductive ring 127 from the 3D-IC module 105 may be equidistant around each side of the 3D-IC module 105. In other embodiments, the lateral separation between the thermally conductive ring 127 from the 3D-IC module 105 may different around each side of the 3D-IC module 105, e.g., on one side the thermally conductive ring 127 may be laterally separated by the first distance $D_1$ and on another side, the ring may be laterally separated by a second distance $D_2$ that is different from the first distance $D_1$. In an embodiment the thermally conductive ring 127 is used to provide a thermal path from the first thermal interface material 111 to the overlying VC-Lid 131.

In an embodiment the thermally conductive ring 127 may comprise a thermally conductive material, such as a material having a thermal conductivity (i.e., "k value") in Watts per meter-Kelvin (W/mK) greater than about 1 W/Mk, such as a thermal conductivity between about 10 W/mK and about 400 W/mK, such as about 380 W/mK. However, any suitable thermal conductivity may be used. In a particular embodiment the thermally conductive ring 127 may comprise a metal such as copper, although any other suitable metal, such as aluminum or the like, may also be used. Similarly, dielectric materials, such as silicone, may also be utilized as long as they are suitable for the transmission of heat from the 3D-IC PKG substrate 103 to the VC-Lid 131.

In an embodiment, the thermally conductive ring 127 may be a vapor chamber ring (VC-ring) and may be formed from similar materials and may function during operation similar to the VC-Lid 131 as described above. The materials of the VC-ring may be different from the materials of the VC-Lid 131 according to some embodiments. In other embodiments, the materials of the VC-ring and the materials of the VC-Lid 131 may be the same. In some embodiments, the VC-ring may be used to provide a distributed heat transfer from the substrate to a thermally coupled overlying structure (e.g., the VC-Lid 131). In other embodiments, the VC-ring may not be thermally coupled to the overlying structure and may provide a distributed heat transfer from the substrate to the environment. Thus, the thermally conductive ring 127 may provide even further increased effectiveness and efficiency of heat transfer away from the 3D-IC PKG substrate 103.

In an embodiment the thermally conductive ring 127 may be placed on the first thermal interface material (TIM) 111, and, in one embodiment, may have a second thickness $T_{127}$ of between about 0.5 mm and about 3 mm, such as about 0.7 mm. Similarly, the thermally conductive ring 127 may have a first width $W_{127}$ of between about 3 mm and about 12 mm, such as about 5 mm. In some embodiments, the first thermal interface material 111 may serve as a flow barrier for a subsequently formed underfill of the interposer 107.

In another embodiment, instead of having a single thermally conductive ring 127 that encircles the 3D-IC module 105 on the 3D-IC PKG substrate 103, multiple thermally conductive rings 127 may be used. In this embodiment a plurality of thermally conductive rings 127 are placed on the first thermal interface material 111, for example, with one ring being within another thermally conductive ring 127. By using multiple thermally conductive rings 127 instead of a single thermally conductive ring, additional support may be provided.

In an embodiment, a heat treatment may be performed in which the first thermal interface material 111 is in a liquid or semi-solid form, in order to cure the first thermal interface material 111 such that the first thermal interface material 111 becomes solid. The heat treatment may be performed by placing the first thermal interface material 111 into e.g., a furnace and heating the first thermal interface material 111. However, the curing is not intended to be limited as such. Rather, any suitable method for curing the first thermal interface material 111, such as irradiating the first thermal interface material 111 or even allowing the first thermal interface material 111 to cure at room temperature may also be utilized. All suitable methods for curing the first thermal interface material 111 are fully intended to be included within the scope of the embodiments.

FIG. 1A further illustrates an application of an underfill material 110 between the 3D-IC PKG substrate 103 and the 3D-IC module 105. In an embodiment the underfill material 110 is a silica filled epoxy resin, and may be used to fill the gap space in between the 3D-IC PKG substrate 103 and the 3D-IC module 105. The underfill material 110 increases mechanical reliability by distributing stresses across the top surface of the 3D-IC PKG substrate 103 rather than allowing them to become concentrated in, e.g., the module external connections 109. In addition, the underfill material 110 provides encapsulation from moisture and contaminants in the external environment.

In an embodiment the underfill material 110 may be injected into the region between the 3D-IC PKG substrate 103 and the 3D-IC module 105. In an embodiment the underfill material 110 is injected using a nozzle that is moved around the 3D-IC PKG substrate 103 and the 3D-IC module 105 while the nozzle injects the underfill material 110 at relatively high pressure into the region between the 3D-IC PKG substrate 103 and the 3D-IC module 105.

FIG. 1A further illustrates a placement of a third thermal interface material 129 over the thermally conductive ring 127. In an embodiment the third thermal interface material 129 may be similar to the first thermal interface material 111 and may be used to provide a thermal interface between the thermally conductive ring 127 (and, hence the 3D-IC PKG substrate 103) and the overlying VC-Lid 131. As such, the third thermal interface 129 may also have a thermal conductivity (i.e., "k value") in Watts per meter-Kelvin (W/mK) of between about 1 W/mK and about 10 W/mK, such as about 4 W/mK. In an embodiment the third thermal interface material 129 may be formed on the thermally conductive ring 127 in either a solid, grease, or gel consistency to a third thickness $T_{129}$ of between about 50 μm and about 200 μm, such as about 100 μm. However, any suitable thickness may be used. If the third thermal interface material 129 is disposed as a non-solid, then the third thermal interface material 129 may be cured in order to solidify the third thermal interface material 129.

FIG. 1A also illustrates the placement of a vapor chamber lid (VC-Lid) 131 over the 3D-IC PKG substrate 103 and the 3D-IC module 105, and in contact with the third thermal interface material 129 and the second thermal interface material 113. In an embodiment the VC-Lid 131 is deployed to protect the 3D-IC PKG substrate 103, and the 3D-IC module 105, and any underlying substrate, and also to help spread the heat generated from the 3D-IC PKG substrate 103 and the 3D-IC module 105 over a larger area, especially for high power applications such as 3D-IC package applications (e.g., chip-on-wafer-on-substrate (CoWoS)). In an embodiment the VC-Lid 131 may comprise copper, aluminum, other metals, alloys, combinations thereof, or other material of high electrical and thermal conductivities. In an embodiment, the VC-Lid 131 has a height $H_{131}$ of between about 2 mm and about 4 mm, such as about 3 mm and has a width $W_{131}$ of between about 30 mm and about 100 mm, such as about 60 mm. Once packaged, according to an embodiment, the semiconductor device 100 may have a height $H_{100}$ of between about 3 mm and about 7 mm, such as about 4.8 mm. According to some embodiments, the VC-Lid 131 may have a thermal conductivity (i.e., "k value") in Watts per meter-Kelvin (W/mK) in a first thermal spreading direction ($k_{xy}$) of between about 10000 W/mK and about 20000 W/mK, for example, and in a second thermal spreading direction ($k_z$) of between about 200 W/mK and about 7000 W/mK, for example. However, any suitable values of thermal conductivity may be used.

Figure 1B:
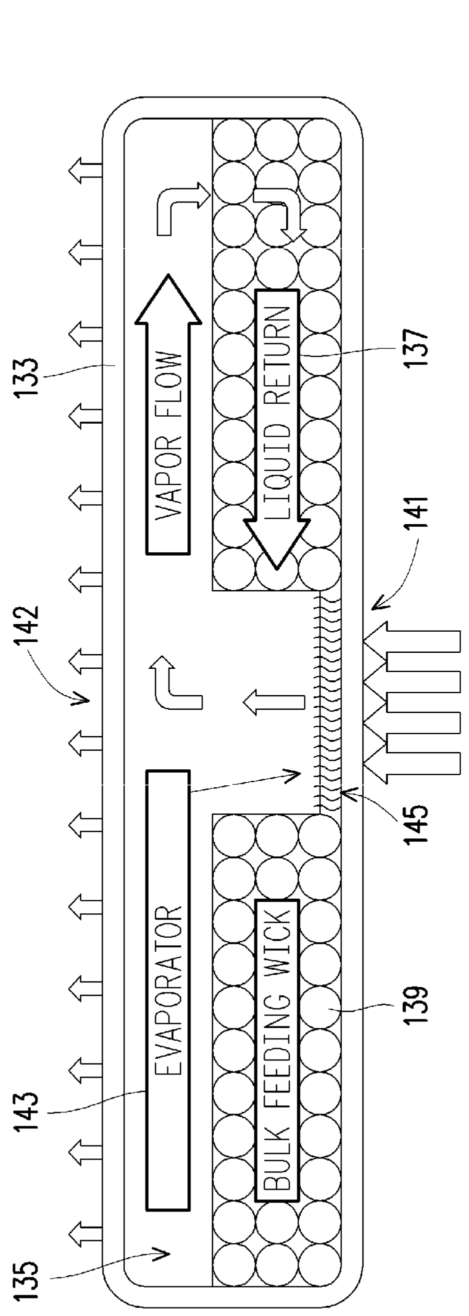
FIG. 1B illustrates a detailed view of a cross-section taken through a center of the vapor chamber lid (VC-Lid) according to some embodiments and FIG. 1B further illustrates a general functional flow of the VC-Lid during operation, in accordance with an embodiment.

Referring to FIG. 1B, this figure illustrates a detailed cross-sectional view of the VC-Lid 131. In an embodiment, the VC-Lid 131 includes an outer shell 133 that encloses, hermetically seals, and defines a cavity between inner walls of the outer shell 133 providing a vapor chamber 135 within the VC-Lid 131. The outer shell 133 of the VC-Lid 131 comprises materials that possess a high thermal conductivity and a low coefficient of thermal expansion (CTE). According to an embodiment, the VC-Lid 131 comprises a material such as copper, copper alloy, copper tungsten (CuW), or aluminum-silicon-carbide (AlSiC). Other suitable thermally conductive materials and/or thermally insulating materials may also be used. In an embodiment, the VC-Lid 131 has a low coefficient of thermal expansion substantially similar to a low coefficient of thermal expansion of the 3D-IC PKG substrate 103.

The thickness of the outer shell 133 of the VC-Lid 131 depends on several factors including, but not limited to, heat dissipation rate of one or more of the plurality of semiconductor dies of the 3D-IC module 105, thermal conductivity of the material of the outer shell 133, presence of an external heat sink, a desired size of the semiconductor device 100, and surface areas of the plurality of semiconductor dies of the 3D-IC module 105. According to some embodiments, the outer shell 133 of the VC-Lid 131 may comprise sheets of thermally conductive material having a substantially uniform thickness. In other embodiments, the outer shell 133 of the VC-Lid 131 may comprise sheets of thermally conductive material having different thicknesses. However, any suitable form of thermally conductive material and any suitable variants of thicknesses may be utilized.

In some embodiments, the dimensions of the vapor chamber 135 may be uniform throughout the VC-Lid 131. For example, the vapor chamber 135 may have a same height, a same length, and a same depth throughout the VC-Lid 131. In other embodiments, one or more of the dimensions of the vapor chamber 135 may be varied throughout the VC-Lid 131. For example, the vapor chamber 135 may have one or more different heights, different lengths, and different depths at different portions within the VC-Lid 131. In an embodiment, the vapor chamber 135 of the VC-Lid 131 may have a height $H_{131}$ of between about 2 mm and about 4 mm, such as about 3 mm. However, any suitable heights or dimensions may be utilized.

For example, as illustrated in FIG. 1B according to an embodiment, the vapor chamber 135 sealed within the VC-Lid 131 may contain an evaporating and condensing liquid such as a two-phase vaporizable liquid which serves as a working fluid (WF) 137 for the VC-Lid 131. The working fluid 137 is a liquid that possesses a relatively high latent heat of vaporization in order to disperse heat away from the 3D-IC module 105. The VC-Lid 131 further comprises a bulk feeding wick layer 139 for receiving the working fluid 137. The bulk feeding wick layer 139 may be housed and sealed within the vapor chamber 135 and positioned along the inner walls of the outer shell 133 that define the vapor chamber 135. In an embodiment, the bulk feeding wick layer 139 may have an average thickness of about 0.1 mm to about 0.5 mm. However, any suitable thickness may be used.

As further illustrated in FIG. 1B, the bulk feeding wick layer 139 may comprise an evaporator 143 (e.g., metallized carbon-nanotube (CNT) evaporator) including a plurality of metal wires 145 (e.g., CNT evaporator lines, coils, wires, or conductors) arranged adjacent one another and woven together. The metal wires 145 have a large amount of pores therein which generate capillary force for transferring the working fluid 137. In some embodiments, the plurality of metal wires 145 are each shaped such that first portions of the metal wires 145 come in physical contact with and are thermally coupled to a first surface of the vapor chamber 135 in an area located along the first surface of the vapor chamber 135 and located in association with a heat intake area of the VC-Lid 131. In some embodiments, second portions of the metal wires 145 that interpose adjacent first portions are raised above the first surface of the vapor chamber 135. For example, the plurality of metal wires 145 may include a serpentine shape with first portions curving towards the first surface of the vapor chamber 135 and interposing second portions curving away from the first surface of the vapor chamber 135. However, any suitable shape may be used.

FIG. 1B further illustrates a general functional flow of the VC-Lid 131 during operation, in accordance with an embodiment. In operation, the VC-Lid 131 works to expel heat generated from the plurality of semiconductor dies of the 3D-IC module 105 through one or more areas of thermal contact 141 (e.g., a heat input area) maintained with the second thermal interface material 113. In some embodiments, the VC-Lid 131 may also work to expel heat generated from the 3D-IC PKG substrate 103 through one or more areas of thermal contact 141 maintained with the third thermal interface material 129 over the thermally conductive ring 127. As the VC-Lid 131 operates and works to conduct and expel heat away from the 3D-IC processor 115, the working fluid 137 contained in the bulk feeding wick layer 139 corresponding to an area of thermal contact 141 (e.g., the heat input area) of the VC-Lid 131 is heated and vaporizes. The vapor of the working fluid 137 then spreads to fill the vapor chamber 135 sealed within the VC-Lid 131 and wherever the vapor comes into contact with a surface of the vapor chamber 135 that is cooler than the working fluid's 137 latent heat of vaporization, heat is expelled through the cooler surfaces (e.g., the heat rejection area 142) of the vapor chamber 135 and the vapor condenses back to its liquid form of the working fluid 137. Once condensed, the working fluid 137 reflows to the area of thermal contact 141 via a capillary force generated by the bulk feeding wick layer 139. Thereafter, the working fluid 137 frequently vaporizes and condenses to form a circulation to expel the heat generated by the plurality of semiconductor dies of the 3D-IC module 105, and/or to expel heat generated, for example, from other electronic components of the 3D-IC PKG substrate 103. This arrangement effectively spreads thermal energy across the VC-Lid 131 so that heat generated by the plurality of semiconductor dies of the 3D-IC module 105 and from other electronic components of the 3D-IC PKG substrate 103 may be drawn off via the heat input area 141 and dissipated via the heat rejection area 142 to the surrounding environment in a highly efficient manner.

According to some embodiments, as illustrated in FIG. 1A, the semiconductor device 100 including the 3D-IC module 105 and the VC-Lid 131 thermally coupled to the 3D-IC module 105 provides greater PKG junction temperature reduction and provides improved temperature uniformity or heat spreading performance as compared to the baseline system described above. For example, a baseline system including a SoC die package (e.g., a high performance multi-chip package such as the 3D-IC module 105 with total power=400 W) with a solid copper lid and a heat sink that is thermally coupled to the solid copper lid may have a maximum baseline PKG junction temperature $T_{maxBL}$ of about 107.4° C., a minimum baseline PKG junction temperature $T_{minBL}$ of about 91.9° C. and a temperature uniformity (i.e., temperature gap between $T_{maxBL}$ and $T_{minBL}$) of about 15.5° C. which corresponds to a baseline heat spreading performance of about 6.5%. As compared to the baseline system, the VC-Lid 131 can reduce the PKG junction baseline maximum temperature, can reduce the PKG junction baseline minimum temperature and can improve the temperature uniformity of the SoC die by reducing the temperature gap between $T_{maxBL}$ and $T_{minBL}$.

Figure 2:
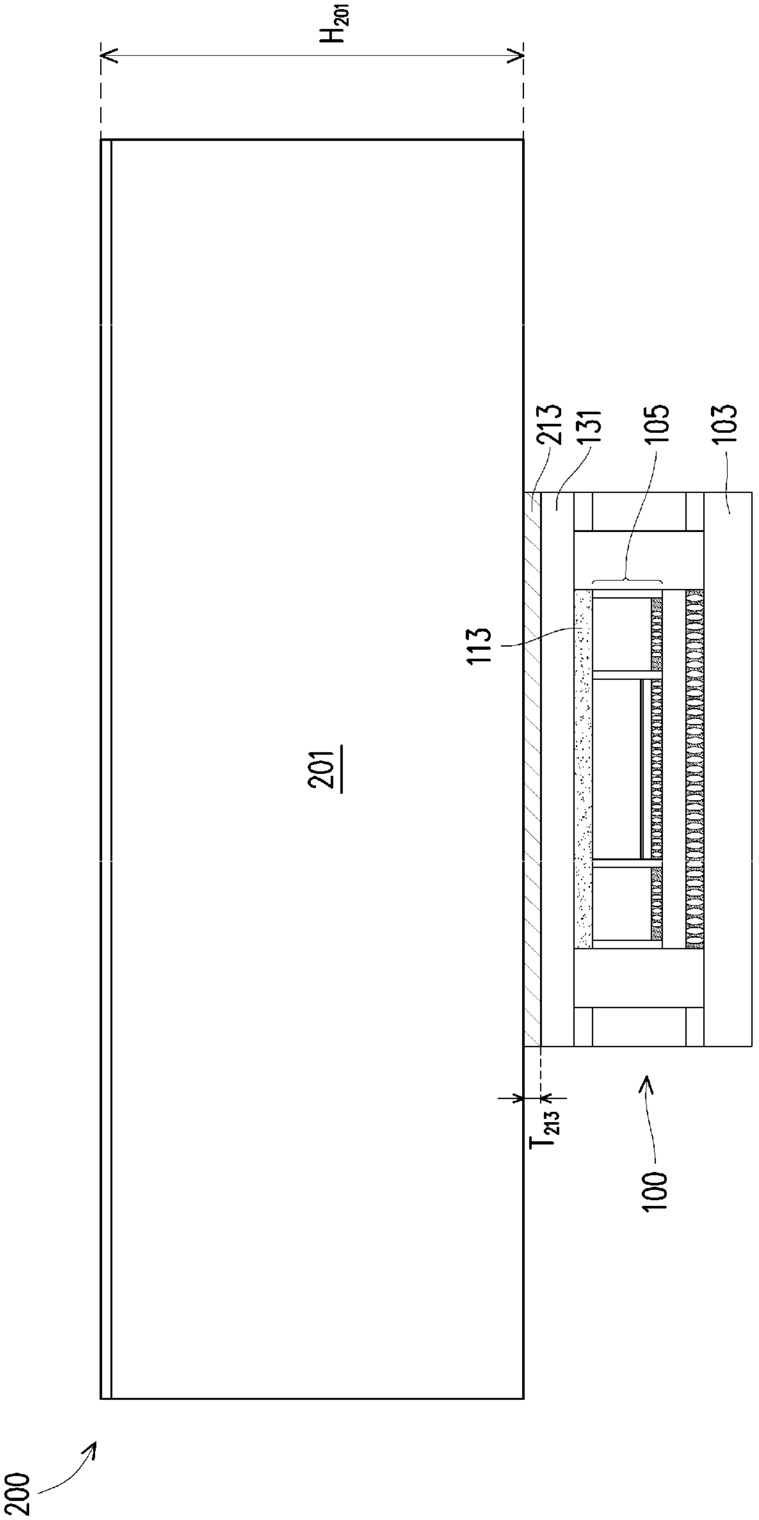
FIG. 2 illustrates a semiconductor device comprising a heat sink coupled to the VC-Lid of the 3D-IC package in accordance with an embodiment.

Turning to FIG. 2, a packaged arrangement 200 may include the packaged semiconductor device 100 and a heat sink 201. In an embodiment the heat sink 201 may be mounted over and thermally coupled to the VC-Lid 131, the 3D-IC module 105 and the 3D-IC PKG substrate 103. The heat sink 201 may be formed using materials exhibiting high thermal conductivity such as aluminum, copper, other metals, alloys, combinations thereof, and the like, and aids in the cooling of the 3D-IC PKG substrate 103 and the 3D-IC module 105 by increasing a given surface area to be exposed to a cooling agent surrounding it such as air. The heat transfer mechanisms occur through the convection of the surrounding air, the conduction through the air, and radiation. For example, the heat sink 201 may exhibit a much greater surface area for convection compared with the surface area of the VC-Lid 131, the 3D-IC PKG substrate 103 and the 3D-IC module 105 by employing a large number of fins in the form of a matrix of geometrically shaped pins or an array of straight or flared fins. In another example, such as where convection is low, a matted-black surface color may radiate much more efficiently than shiny, metallic colors in the visible spectrum. Any suitable form for the heat sink may be utilized. In an embodiment the heat sink 201 may have a height $H_{201}$ of between about 20 mm and about 120 mm, such as about 90 mm.

In an embodiment the heat sink 201 has a contact area that is thermally coupled to the VC-Lid 131 through a fourth thermal interface material (TIM) 213. The fourth thermal interface material 213 may be placed on a top surface of the VC-Lid 131 in order to provide a thermal interface between the VC-Lid 131 and the overlying heat sink 201. In an embodiment the fourth thermal interface material 213 may be similar to the second thermal interface material 113, although the fourth thermal interface material 213 may also be different from the second thermal interface material 113. In an embodiment the fourth thermal interface material 213 may be disposed onto the VC-Lid 131 in either a solid, grease, or gel consistency to a fourth thickness $T_{213}$ of between about 50 μm and about 500 such as about 100 However, any suitable thickness may be used. According to some embodiments, the fourth thermal interface material 213 may have a thermal conductivity (i.e., "k value") in Watts per meter-Kelvin (W/mK) of between about 5 W/mK and about 10 W/mK, for example. However, any suitable value of thermal conductivity may be used.

In the packaged arrangement 200 shown in FIG. 2, the thermal energy spread across the VC-Lid 131 provides for a large footprint at the contact area of the heat sink 201 which allows for an improved thermal performance of the heat sink 201 and thus of the overall package of the packaged arrangement 200. For example, as the VC-Lid 131 draws off and transfers heat generated by the plurality of semiconductor dies of the 3D-IC module 105 and from other electronic components of the 3D-IC PKG substrate 103 to the heat sink 201, the large footprint allows for a bigger area of the heat sink 201 to draw off and transfer heat more efficiently from the VC-Lid 131 to the surrounding environment. Therefore, the packaged arrangement 200 provides greater thermal performance for the semiconductor device 100.

According to some embodiments, as illustrated in FIG. 2, the packaged arrangement 200 including the 3D-IC module 105, the VC-Lid 131 thermally coupled to the 3D-IC module 105 and the heat sink 201 thermally coupled to the VC-Lid 131 may offer further PKG junction temperature reduction and heat spreading performance improvement as compared to the baseline system described above. In an embodiment, the SoC die package including the vapor chamber lid (VC-Lid) 131 and the heat sink thermally coupled to the VC-Lid may reduce the PKG junction temperatures $T_{maxBL}$ and $T_{minBL}$ to about 84.5% of the baseline temperatures and may provide about 300% heat spreading performance as compared to the baseline system. For example, the VC-Lid 131 with thermally coupled heat sink 201 may have a reduced maximum PKG junction temperature $T_{max\text{-}SoC}$ of about 90.8° C. and may have a reduced maximum PKG junction temperature $T_{min\text{-}SoC}$ of about 85.6° C. The improved temperature uniformity or improved temperature gap between $T_{max\text{-}SoC}$ and $T_{min\text{-}SoC}$ is about 5.1° C. which corresponds to a heat spreading performance of about 19.5%. Accordingly, the heat spreading performance of about 19.5% of the arrangement including the thermally coupled combination of the VC-Lid 131 and the heat sink 201 as compared to the baseline heat spreading performance of about 6.5% shows that this arrangement has a heat spreading performance of about 300% as compared to the heat spreading performance of the baseline system.

Figure 3:
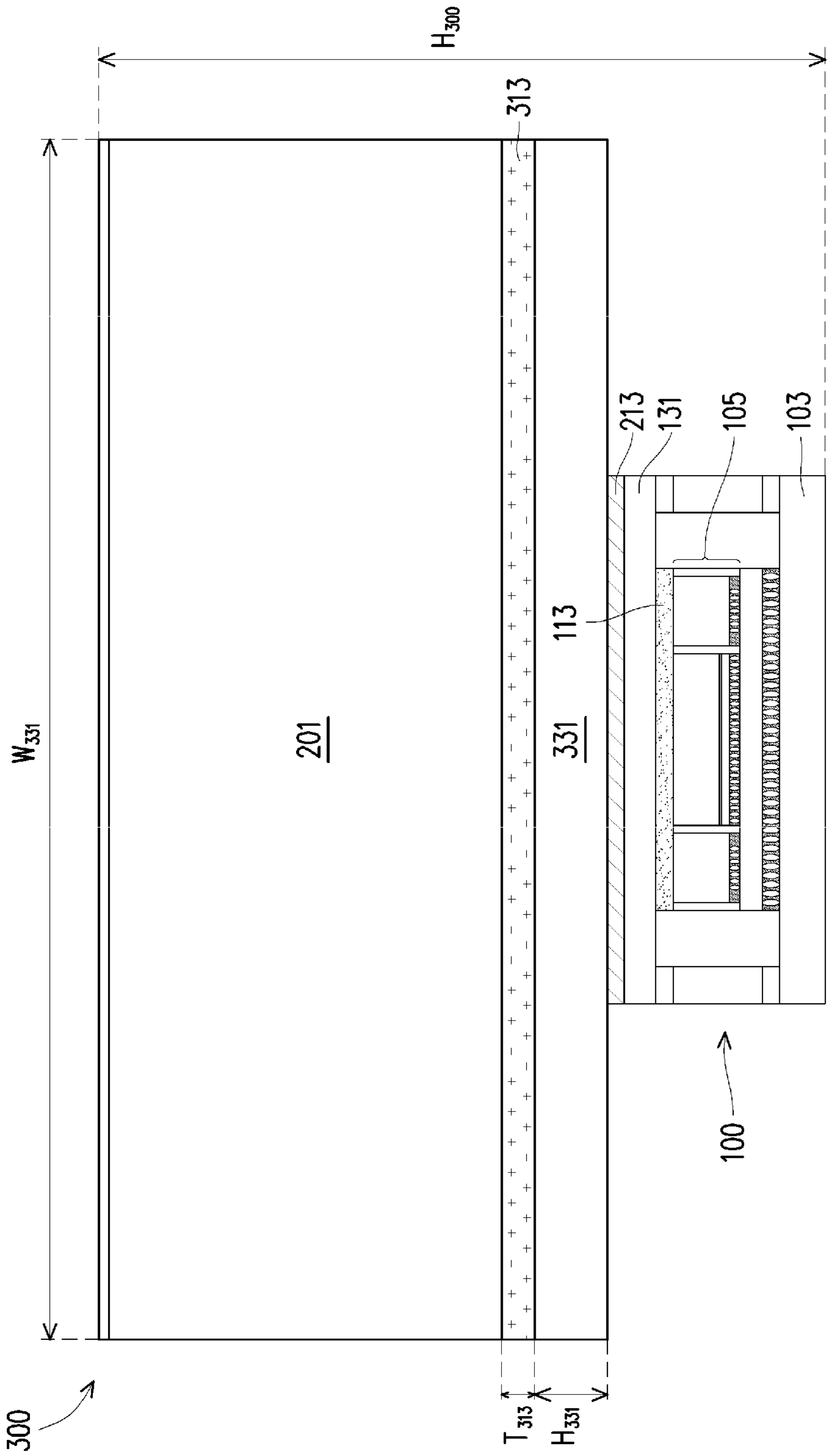
FIG. 3 illustrates a semiconductor device comprising a vapor chamber (VC) heat sink (VC-HS) coupled to the VC-Lid of the 3D-IC package in accordance with an embodiment.

FIG. 3 illustrates a packaged arrangement 300 including the semiconductor device 100, a vapor chamber heat sink (VC-HS) 331, and the heat sink 201. In an embodiment, the fourth thermal interface material 213 may be applied to a top surface of the VC-Lid 131 or to a surface of the VC-HS 331 in order to provide a thermal interface between the VC-Lid 131 and the overlying vapor chamber heat sink (VC-HS) 331. In an embodiment, the VC-HS 331 has a height $H_{331}$ of between about 1 mm and about 3 mm, such as about 2 mm and has a width $W_{331}$ of between about 50 mm and about 200 mm, such as about 100 mm. Once packaged, according to an embodiment, the packaged arrangement 300 may have a height $H_{300}$ of between about 20 mm and about 150 mm, such as about 100 mm. According to some embodiments, the VC-HS 331 may have a thermal conductivity (i.e., "k value") in Watts per meter-Kelvin (W/mK) in a first thermal spreading direction ($k_{xy}$) of between about 10000 W/mK and about 20000 W/mK, for example, and in a second thermal spreading direction ($k_z$) of between about 200 W/mK and about 7000 W/mK, for example. However, any suitable values of thermal conductivity may be used.

In some embodiments, the vapor chamber heat sink (VC-HS) 331 may be formed from similar materials and function during operation similar to the VC-Lid 131 as described above with respect to FIG. 1A. The materials of the VC-HS 331 may be different from the materials of the VC-Lid 131 according to some embodiments. In other embodiments, the materials of the VC-HS 331 and the materials of the VC-Lid 131 may be the same. The VC-HS 331 may be used to provide a distributed heat transfer from the VC-Lid 131 to the overlying heat sink 201, thereby providing an even further increased effectiveness and efficiency of heat transfer from the 3D-IC module 105 and from the 3D-IC PKG substrate 103 to the heat sink 201.

In an embodiment, a fifth thermal interface material (TIM) 313 may be applied to a top surface of the VC-HS 331 or to a surface of the heat sink 201 in order to provide a thermal interface between the VC-HS 331 and the overlying heat sink 201. In some embodiments, a material of the fifth thermal interface material 313 (e.g., solder) may be a different material from the material of the fourth thermal interface material 213. In other embodiments, the material of the fifth thermal interface material 313 may be the same material used for the fourth thermal interface material 213. In an embodiment the fifth thermal interface material 313 may be applied in either a solid, grease, or gel consistency to the fifth thickness $T_{313}$ of between about 50 μm and about 200 μm, such as about 100 μm. However, any suitable thermal interface materials and thickness may be used. According to some embodiments, the fifth thermal interface material 313 may have a thermal conductivity (i.e., "k value") in Watts per meter-Kelvin (W/mK) of between about 1 W/mK and about 10 W/mK, such as k=5.8 W/mK. In some embodiments, the fifth thermal interface material 313 is a material such as metallic solder TIM, a metallic sheet TIM, or a film type TIM such as CNT or graphite based TIM, which may have a thermal conductivity (i.e., "k value") in Watts per meter-Kelvin (W/mK) of between about 30 W/mK to 50 W/mK and about 86 W/mK, for example. However, any suitable values of thermal conductivity may be used.

In the packaged arrangement 300 shown in FIG. 3, the thermal energy spread across the VC-Lid 131 provides for a large footprint at the contact area of the VC-HS 331 which allows for an improved thermal performance of the VC-HS 331 and thus of the overall package of the packaged arrangement 300. For example, as the VC-Lid 131 draws off heat generated by the plurality of semiconductor dies of the 3D-IC module 105 and from other electronic components of the 3D-IC PKG substrate 103, the VC-Lid 131 spreads the thermal energy of the drawn off heat across a contact area of the VC-HS 331. In other words, the VC-Lid 131 allows for heat generated by the plurality of semiconductor dies of the 3D-IC module 105 and from other electronic components of the 3D-IC PKG substrate 103 to be transferred through the fourth thermal interface material TIM 213 to the VC-HS 331 in a highly efficient manner. Once transferred to the VC-HS 331, the thermal energy is spread further across the VC-HS 331 providing for an even larger footprint at the contact area of the heat sink 201, as compared to the footprint provided by the VC-Lid 131, allowing for an even more improved thermal performance of the heat sink 201 and thus of the overall package of the packaged arrangement 300. For example, as the VC-HS 331 draws off and transfers heat from the VC-Lid 131 to the heat sink 201, the even larger footprint allows for a bigger area of the heat sink 201 (e.g., the entire surface of the heat sink 201 facing the VC-HS 331) to draw off and transfer heat even more efficiently from the VC-HS 331 to the surrounding environment. Therefore, the packaged arrangement 300 provides an even greater thermal performance for the semiconductor device 100.

With regard to the vapor chamber heat sink (VC-HS), the VC-HS has a thermal improvement performance similar or equivalent to the VC-Lid. According to some embodiments, as illustrated in FIG. 3, the packaged arrangement 300 including the 3D-IC module 105, the VC-Lid 131 thermally coupled to the 3D-IC module 105, the VC-HS 331 thermally coupled to the VC-Lid 131 and the heat sink 201 thermally coupled to the VC-HS 331 may offer PKG junction temperature reduction and heat spreading performance improvement as compared to the baseline system described above. For example, the packaged arrangement 300 may reduce the PKG junction temperatures $T_{maxBL}$ and $T_{minBL}$ to about 84.3% of the baseline temperatures and may provide about 288% heat spreading performance as compared to the baseline system. For example, the packaged arrangement 300 may have a reduced maximum PKG junction temperature $T_{max\text{-}SoC}$ of about 92.6° C. and may have a reduced maximum PKG junction temperature $T_{min\text{-}SoC}$ of about 87.3° C. The improved temperature uniformity or improved temperature gap between $T_{max\text{-}SoC}$ and $T_{min\text{-}SoC}$ is about 5.3° C. which corresponds to a heat spreading performance of about 18.7%. Accordingly, the heat spreading performance of about 18.7% of the packaged arrangement 300 as compared to the baseline heat spreading performance of about 6.5% shows that this arrangement has a heat spreading performance of about 288% as compared to the heat spreading performance of the baseline system.

Figure 4:
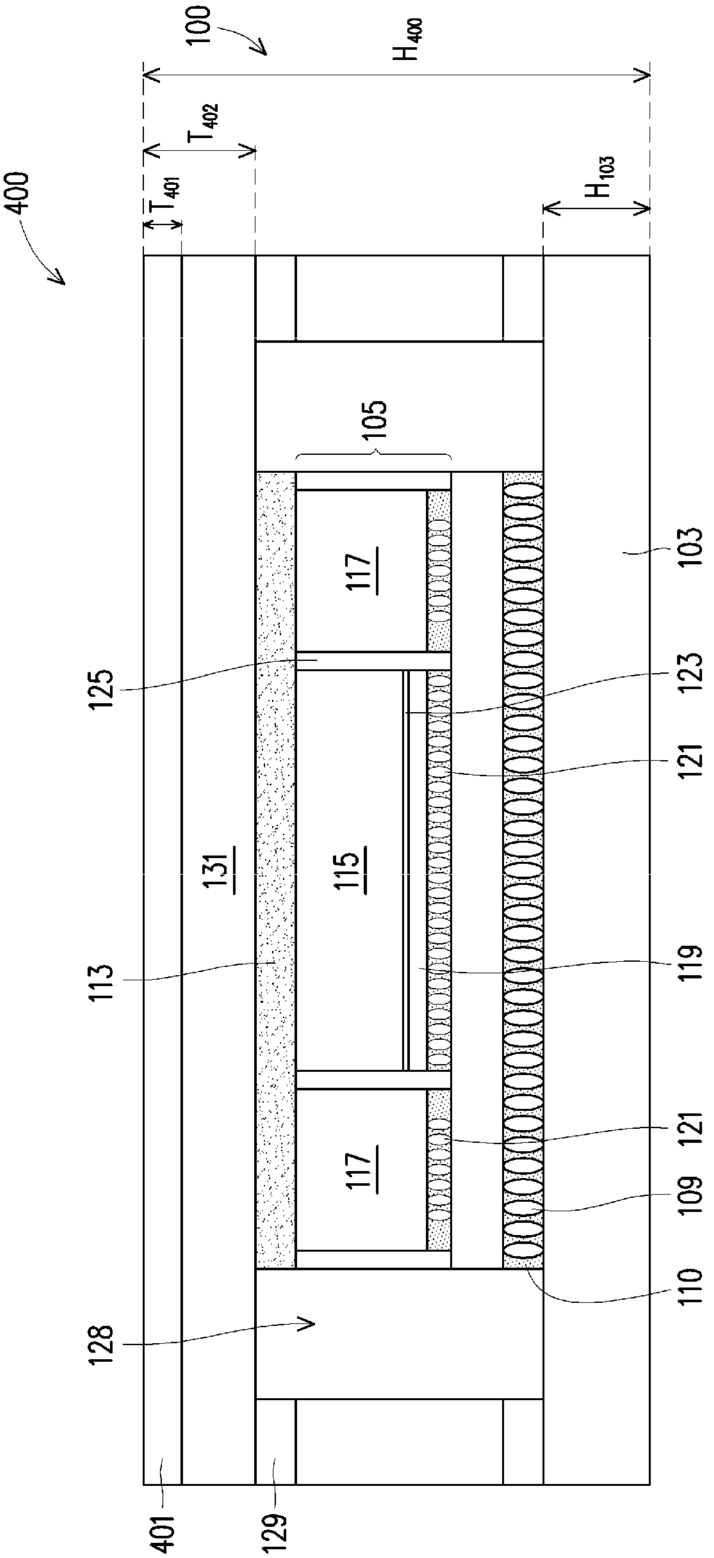
FIG. 4 illustrates a semiconductor device comprising a conductive sheet coupled to the VC-Lid of the 3D-IC package in accordance with an embodiment.

With reference to FIG. 4, a packaged arrangement 400 may include the semiconductor device 100 and a conductive sheet 401. In an embodiment the conductive sheet 401 may be mounted over and thermally coupled to the VC-Lid 131, the 3D-IC module 105 and the 3D-IC PKG substrate 103. The conductive sheet 401 may provide extra structural support, structural integrity, and added protection to the VC-Lid 131 extending over larger areas, especially for package applications including multiple dies such as 3D-IC package applications (e.g., chip-on-wafer-on-substrate (CoWoS)) and to provide suitable heat dissipation. The conductive sheet 401 may be implemented using low cost materials and techniques in manufacturing while providing increased reliability of the semiconductor device 100.

In some embodiments, the conductive sheet 401 may be formed using similar materials as that of the outer shell 133 of the VC-Lid 131 with similar thermal conductivity characteristics and similar coefficient of thermal expansion (CTE) properties. According to an embodiment, the conductive sheet 401 comprises a material such as copper, copper alloy, copper tungsten (CuW), indium, indium alloy or aluminum-silicon-carbide (AlSiC). Other suitable materials may also be used. In some embodiments, the conductive sheet 401 has a low coefficient of thermal expansion substantially similar to a low coefficient of thermal expansion of one or more of the materials of the VC-Lid 131 and the 3D-IC PKG substrate 103. However, in other embodiments, one or more of the materials of the conductive sheet 401 may be different from the materials of the outer shell 133 of the VC-Lid 131. In an embodiment, the conductive sheet 401 may have a thickness $T_{401}$ of between about 0.1 mm and about 0.35 mm, such as about 0.25 mm. In an embodiment, the combination of VC-Lid 131 and conductive sheet 401 may have a combined thickness $T_{402}$ of between about 2200 mm and about 3800 mm, such as about 3.25 mm. In an embodiment the conductive sheet 401 has one or more contact areas that are bonded (e.g., solder bonding, metal-to-metal bonding, etc.) to the VC-Lid 131. However, any suitable bonding process may be used. Once assembled, according to embodiments, the packaged arrangement 400 may have an overall height $H_{400}$ of between about 5 mm and about 8 mm, such as about 6 mm.

Figure 5:
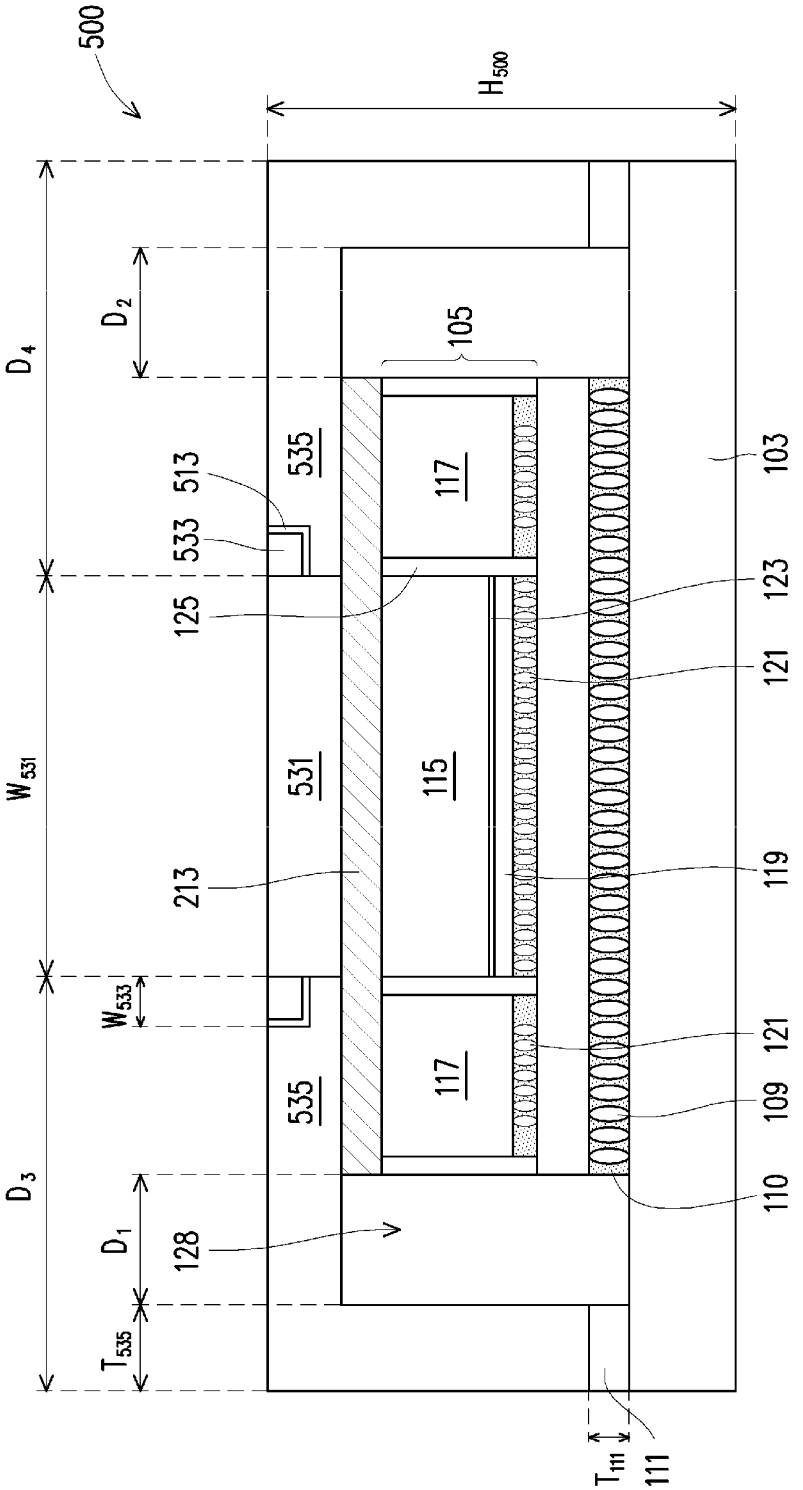
FIG. 5 illustrates a semiconductor device comprising a 3D-IC package including a VC-Lid in accordance with another embodiment.

With reference to FIG. 5, a packaged arrangement 500 may include the 3D-IC PKG substrate 103, the 3D-IC module 105, an embedded VC-Lid 531, and a VC-Lid Frame 535. In an embodiment, the 3D-IC PKG substrate 103 is bonded to the first side of the 3D-IC module 105, the VC-Lid Frame 535 is connected to the 3D-IC PKG substrate 103 via the first thermal interface material (TIM) 111 and supports the embedded VC-Lid 531 and the embedded VC-Lid 531 is bonded to the second side of the 3D-IC module 105 via the fourth thermal interface material (TIM) 213.

In an embodiment the first thermal interface material (TIM) 111 is thermally coupled to the VC-Lid Frame 535 and may be spaced from the 3D-IC module 105 at the same first distance $D_1$ and same second distance $D_2$ and have the same thickness Till, as discussed above with respect to FIG. 1A. In other embodiments, the first thermal interface material 111 may be spaced apart from the 3D-IC module 105 based on one or more of a thickness $T_{535}$ of the VC-Lid Frame 535 and a location of the 3D-IC module 105 on the 3D-IC PKG substrate 103. In an embodiment, the thickness $T_{535}$ of the VC-Lid Frame 535 may be between about 3 mm and about 15 mm, such as about 5 mm. However, any suitable thicknesses and distances may be used.

According to some embodiments, the first thermal interface material 111 is arranged to have a large amount of surface area contact with the 3D-IC PKG substrate 103 and with the VC-Lid Frame 535 increasing the ability of heat to be transferred from the 3D-IC PKG substrate 103, through the first thermal interface material 111 and through the VC-Lid Frame 535, in order to aid in the removal of heat from the 3D-IC PKG substrate 103. In an embodiment, the VC-Lid Frame 535 may comprise a thermally conductive material, such as a material having a thermal conductivity (i.e., “k value”) in Watts per meter-Kelvin (W/mK) that is greater than 1 W/mK. In some embodiments, the VC-Lid Frame 535 comprises a thermally conductive material having a thermal conductivity of between about 200 W/mK and about 400 W/mK, such as about 380 W/mK. In a particular embodiment the suspended VC-Lid Frame 535 may comprise a metal such as copper, although any other suitable metal, such as aluminum or the like, may also be used. Similarly, dielectric materials, such as silicone, may also be utilized as long as they are suitable for the transmission of heat from the 3D-IC PKG substrate 103 to the suspended VC-Lid 531.

As further illustrated in FIG. 5, the VC-Lid Frame 535 may be used to provide both support for the suspended VC-Lid 531 and to provide a thermal path from the 3D-IC PKG substrate 103. In some embodiments, the VC-Lid Frame 535 may be bonded to the first thermal interface material 111 and may be laterally separated from the 3D-IC module 105 on one side by the first distance $D_1$ and on another side by the second distance $D_2$. The VC-Lid Frame 535 may also extend to encircle the 3D-IC module 105 forming the cavity 128 between inner walls of the VC-Lid Frame 535. According to some embodiments, the first distance $D_1$ and the second distance $D_2$ of the VC-Lid Frame 535 may be the same as the first distance $D_1$ and the second distance $D_2$ of the thermally conductive ring 127 discussed above with regard to FIG. 1A and in other embodiments, the first distance $D_1$ and the second distance $D_2$ of the VC-Lid Frame 535 may be different from the first distance $D_1$ and the second distance $D_2$ of the thermally conductive ring 127. However, any suitable distance may be used. In some embodiments, portions of the VC-Lid Frame 535 may overlie and be thermally coupled to portions of the second surface of the 3D-IC module 105 via the fourth thermal interface material 213.

As further illustrated in FIG. 5, the VC-Lid Frame 535 may support the suspended VC-Lid 531 over a certain area of the 3D-IC module 105 at a third distance $D_3$ from an outer edge of the VC-Lid Frame 535 and at a fourth distance $D_4$ of the suspended VC-Lid 531 from another outer edge of the VC-Lid Frame 535. According to an embodiment, the suspended VC-Lid 531 is supported at the third distance $D_3$ and the fourth distance $D_4$ from the outer edge of the VC-Lid Frame 535 based on a location of a desired certain area of the 3D-IC module 105 to be cooled. For example, the suspended VC-Lid 531 may be positioned over a "hot-spot" area which is a certain area that experiences a greater amount of generated heat as compared to other areas of the 3D-IC module 105. For example, the VC-Lid Frame 535 may be configured to suspend the suspended VC-Lid 531 in the location over the 3D-IC processor 115 which may generate a greater amount of heat as compared to other areas of the 3D-IC module 105 (e.g., areas over the 3D-IC memory dies 117) or as compared to other areas over the 3D-IC PKG substrate 103 not occupied by the 3D-IC module 105.

The suspended VC-Lid 531 may be formed from similar materials and during operation, may function similar to the VC-Lid 131, as discussed above with respect to FIG. 1A. As shown in FIG. 5, the suspended VC-Lid 531 may be suspended by the VC-Lid Frame 535 over a "hot-spot" area (e.g., over the 3D-IC processor 115) of the 3D-IC module 105 and a portion of the suspended VC-Lid 531 may be thermally coupled to the second surface of the 3D-IC module 105 via the fourth thermal interface material 213. In an embodiment, the thermally coupled portion of the suspended VC-Lid 531 has a first width $W_{531}$ which may be between about 10 mm and about 40 mm, such as about 25 mm. In some embodiments, portions of the suspended VC-Lid 531 may be in direct contact with and may be thermally coupled to portions of the VC-Lid Frame 535. According to some embodiments, the suspended VC-Lid 531 may have a thermal conductivity (i.e., "k value") in Watts per meter-Kelvin (W/mK) in a first thermal spreading direction ($k_{xy}$) of between about 10000 W/mK and about 20000 W/mK, for example, and in a second thermal spreading direction ($k_z$) of between about 200 W/mK and about 7000 W/mK, for example. However, any suitable values of thermal conductivity may be used.

In yet another embodiment the VC-Lid 131 may be embedded or integrally formed within a conductive lid or within a conductive frame. For example, the suspended VC-Lid 531 may be located over a hot spot of the 3D-IC module 105 (e.g., the GPU) while a remainder of the conductive lid or the conductive frame may extend over the other structures within the package.

In an embodiment, the suspended VC-Lid 531 comprises flanges 533 that are supported by underlying supporting members of the VC-Lid Frame 535. The flanges 533 of the suspended VC-Lid 531 may be bonded to the underlying supporting members of the VC-Lid Frame 535. In some embodiments, the flanges 533 may be bonded to the underlying supporting members of the VC-Lid Frame 535 via a sixth thermal interface material (TIM) 513. However, other bonding methods and materials (e.g., solder) may be used to bond the flanges 533 to the VC-Lid Frame 535. In an embodiment, the flanges 533 of the suspended VC-Lid 531 have a width $W_{533}$ that may be between about 3 mm and about 6 mm, such as about 4 mm.

Once assembled, the packaged arrangement 500 may have an overall height $H_{500}$ of between about 4 mm and about 8 mm, such as about 5.5 mm. The packaged arrangement 500 may also utilize one or more of the heat sink 201, the vapor chamber heat sink (VC-HS) 331 and the conductive sheet 401 as discussed above in regards to FIGS. 2-4.

In some embodiments the suspended VC-Lid 531 may be embedded or integrally formed within a conductive lid or within a conductive frame (e.g., VC-Lid Frame 535). For example, the suspended VC-Lid 531 may be located over a hot spot of the 3D-IC module 105 (e.g., located over the 3D-IC processor 115 such as a graphics processing unit (GPU)) while a remainder of the conductive lid may extend over a remainder of the structures within the 3D-IC module 105. This allows for low cost custom designs to be implemented by locating the suspended VC-Lid 531 directly over a specific hot spot of a custom 3D-IC module 105 for each product. Using the suspended VC-Lid 531 reduces any invalid thermal spreading area of the suspended VC-Lid 531 which may lower the cost of implementation for very large highly integrated packages.

Figure 6:
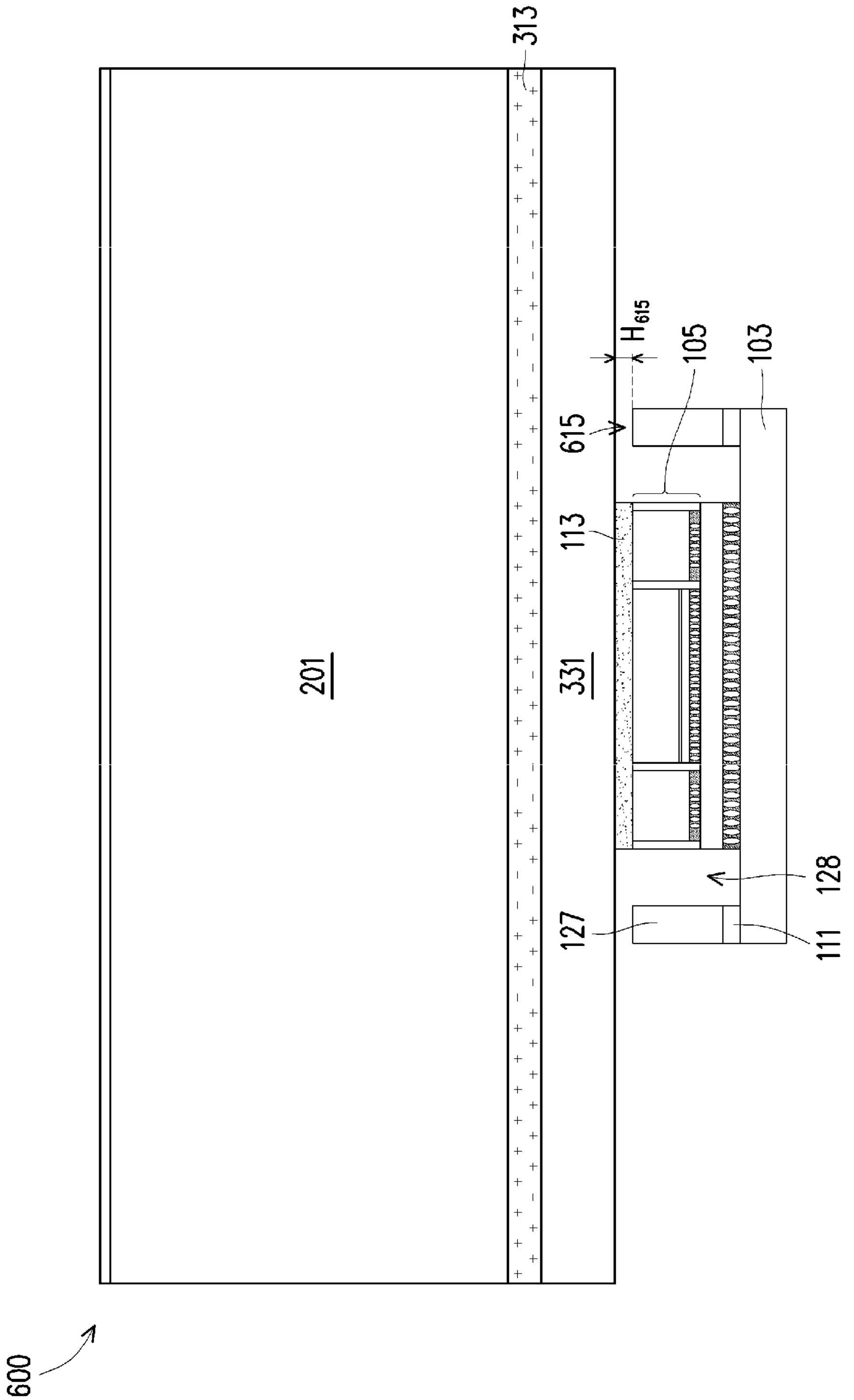
FIG. 6 illustrates a semiconductor device comprising the VC heat sink and the 3D-IC package without the VC-Lid, the VC heat sink being coupled to a 3D-IC module of the semiconductor device in accordance to an embodiment.

FIG. 6 illustrates a packaged arrangement 600 which may include the 3D-IC PKG substrate 103, the 3D-IC module 105, the thermally conductive ring 127, the vapor chamber heat sink (VC-HS) 331, and the heat sink 201. In an embodiment, the 3D-IC PKG substrate 103 is bonded to the first side of the 3D-IC module 105, the thermally conductive ring 127 is bonded to the 3D-IC PKG substrate 103 via the first thermal interface material (TIM) 111, the VC-HS 331 is bonded to the second side of the 3D-IC module 105 via the second thermal interface material (TIM) 113 and the heat sink 201 is bonded to VC-HS 331 via the fifth thermal interface material (TIM) 313.

FIG. 6 further illustrates a gap 615 between an upper surface of the thermally conductive ring 127 and a lower surface of the VC-HS 331. The thermally conductive ring 127 may be bonded and thermally coupled to the 3D-IC PKG substrate 103 via the first thermal interface material (TIM) 111. The opposite end of the thermally conductive ring 127 from the end bonded and thermally coupled to the 3D-IC PKG substrate 103 may be separated from the VC-HS 331 by the gap 615. Accordingly, a thermal path from the first thermal interface material 111 is formed to expel heat transferred from components of the 3D-IC PKG substrate 103 to the surrounding environment. In addition, during operation of the packaged arrangement 600, heat generated from the 3D-IC PKG substrate 103 and from the 3D-IC module 105 may be vented through the gap 615 in order to allow heat to escape from the cavity 128 in order to maintain a lower temperature surrounding the 3D-IC module 105.

In an embodiment, the gap 615 may have a height $H_{615}$ that corresponds to the thickness of the second thermal interface material (TIM) 113. In other embodiments, the height $H_{615}$ of the gap 615 may be different from the thickness of the second thermal interface material 113. In an embodiment, the height $H_{615}$ of the gap 615 may be between about 0.03 mm and about 0.2 mm, such as about 0.05 mm. However, any suitable height may be used for the gap 615.

The vapor chamber heat sink (VC-HS) 331 may be used to provide a distributed heat transfer directly from the 3D-IC module 105 to the overlying heat sink 201, thereby providing an increased effectiveness and efficiency of heat transfer from the 3D-IC module 105 to the heat sink 201. In the packaged arrangement 600 shown in FIG. 6, the thermal energy spread across the VC-HS 331 provides for a large footprint at the contact area of the heat sink 201 which allows for an improved thermal performance of the heat sink 201 and thus the overall packaged arrangement 600. For example, as the VC-HS 331 draws off heat generated by the plurality of semiconductor dies of the 3D-IC module 105, the VC-HS 331 spreads the thermal energy of the drawn off heat across a contact area of the heat sink 201. In other words, the VC-HS 331 allows for heat generated by the plurality of semiconductor dies of the 3D-IC module 105 to be transferred through the fifth thermal interface material 313 to the heat sink 201 in a highly efficient manner. For example, as the VC-HS 331 draws off and transfers heat from the plurality of semiconductor dies of the 3D-IC module 105 to the heat sink 201, the large footprint allows for a bigger area of the heat sink 201 (e.g., the entire surface of the heat sink 201 facing the VC-HS 331) to draw off and transfer heat more efficiently to the surrounding environment. Therefore, the packaged arrangement 600 provides a greater thermal performance for the semiconductor device 100.

According to some embodiments, as illustrated in FIG. 6, the arrangement 600 including the 3D-IC module 105, the thermally conductive ring 127 forming a cavity for the 3D-IC module 105, the VC-HS 331 thermally coupled to the 3D-IC module 105 with a gap 615 between the thermally conductive ring 127 and the VC-HS 331, and the heat sink 201 thermally coupled to the VC-HS 331 may offer PKG junction temperature reduction and heat spreading performance as compared to the baseline system described above. For example, the arrangement 600 may reduce the PKG junction temperatures $T_{maxBL}$ and $T_{minBL}$ to about 83.9% of the baseline temperatures and may provide about 292% heat spreading performance as compared to the baseline system. Furthermore, the arrangement 600 may have a reduced maximum PKG junction temperature $T_{max\text{-}SoC}$ of about 90.2° C. and may have a reduced maximum PKG junction temperature $T_{min\text{-}SoC}$ of about 84.9° C. The improved temperature uniformity or improved temperature gap between $T_{max\text{-}SoC}$ and $T_{min\text{-}SoC}$ is about 5.3° C. which corresponds to a heat spreading performance of about 19.0%. Accordingly, the heat spreading performance of about 19.0% of the arrangement 600 as compared to the baseline heat spreading performance of about 6.5% shows that this arrangement has a heat spreading performance of about 292% as compared to the heat spreading performance of the baseline system.

Figure 7:
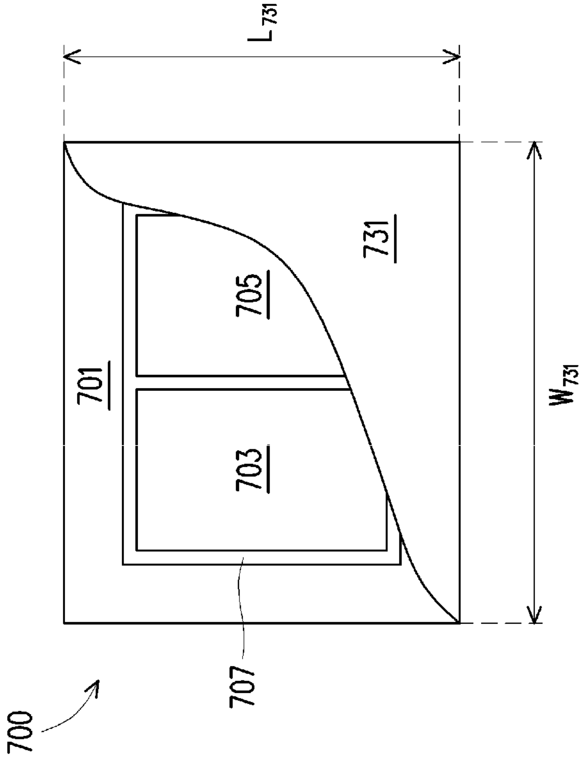
FIGS. 7-8 illustrate an integrated InFO oS vapor chamber lid in accordance with some embodiments.

FIG. 7 is an overhead view illustrating an internal fan out on substrate (InFO oS) package 700 with an integrated InFO oS vapor chamber Lid (VC-Lid) 731, according to some embodiments. The integrated InFO oS VC-Lid 731 is illustrated in "cut-away" form in order to better illustrate the components of the InFO oS package 700. The InFO oS package 700 comprises a system substrate 701, a plurality of system on chip (SoC) dies (e.g., a first SoC die 703 and a second SoC die 705) electrically coupled to a surface of the system substrate 701 and embedded in a molding compound 707, wherein the integrated InFO oS VC-Lid 731 overlies and is thermally coupled to the plurality of SoC dies (703, 705), according to some embodiments.

The system substrate 701 may be similar to the 3D-IC PKG substrate 103, as described above or may be any suitable substrate for use in packaging a plurality of SoC dies. The first SoC die 703 may be, for example, a first 3D-IC processing die (e.g., a first 3D-IC module 105) and the second SoC die 705 may be, for example, a second 3D-IC processing die (e.g., a second 3D-IC module 105). However, the first SoC die 703 and the second SoC die 705 may be any suitable semiconductor dies and are not limited to system on chip configurations. According to some embodiments, the integrated InFO oS VC-Lid 731 may have a width $W_{731}$ of between about 50 mm and about 100 mm, such as about 60 mm and may have a length $L_{731}$ of between about 50 mm and about 100 mm, such as about 60 mm. However, any suitable width $W_{731}$ and any suitable length may be used for the width $W_{731}$ and length $L_{731}$ of the integrated InFO oS VC-Lid 731.

Figure 8:
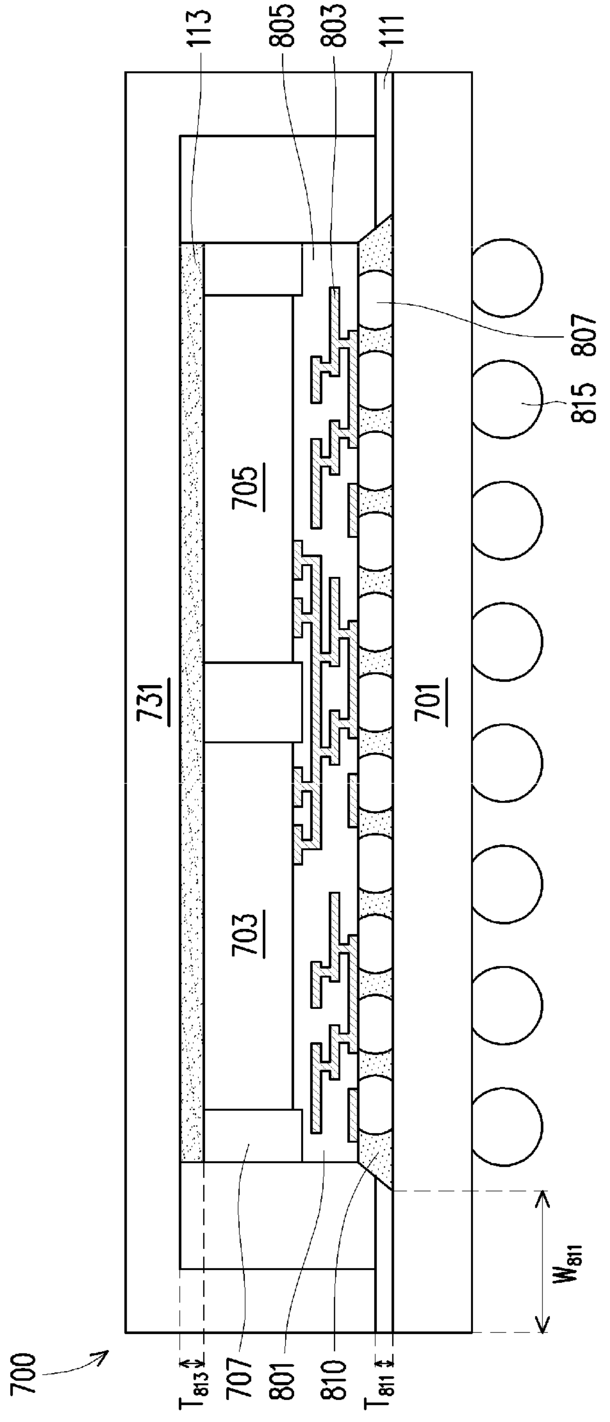

FIG. 8 is a cross-sectional view illustrating the InFO oS package 700 of FIG. 7. According to some embodiments, the plurality of system on chip (SoC) dies (703, 705) may be electrically coupled to a surface of the system substrate 701 via an InFO redistribution layer (RDL) 801. The InFO RDL 801 includes a series stack of alternating layers of a series of conductive layers 803 and a series of dielectric layers 805. In some embodiments, the series of conductive layers 803 may include a plurality of conductive lines and a plurality of conductive vias formed of one or more metal materials (e.g., copper (Cu), gold (Au), alloys thereof and the like) via a processes such as plating, however, any suitable materials and any other suitable methods of deposition (e.g., CVD or PVD) may be used to form the plurality of conductive lines and the plurality of conductive vias of the series of conductive layers 803. The series of dielectric layers 805 may be formed of any suitable dielectric materials such as polybenzoxazole (PBO), polyimide or a polyimide derivative using any suitable deposition method (e.g., spin-coating process). However, any suitable methods may be used for forming the series of conductive layers 803 within the series of dielectric layers 805.

According to embodiments, the plurality of conductive lines and the plurality of conductive vias of the conductive layers 803 are electrically connected through the series of dielectric layers 805 from a first side of the InFO RDL 801 to a second side of the info RDL 801. The electrical connection may be formed by either forming the InFO RDL 801 on the SoC dies (703, 705) after the SoC dies have been encapsulated, or else forming the InFO RDL 801, placing the SoC dies (703, 705) on the InFO RDL 801, and then encapsulating the SoC dies (703, 705). Any suitable method of manufacturing the SoC dies (703, 705) may be utilized.

Once encapsulated and connected, external InFO contacts 807 are formed to contact areas of the second surface of the info RDL 801. The external InFO contacts 807 may be formed using one or more of the materials and using one or more of the methods used to form the module external connections 109, as described above. For example, the external InFO contacts 807 may be formed as solder balls, C4 bumps, micro-bumps, pillars, columns, or other structures formed from a conductive material such as solder, metal, or metal alloy. As such, the external InFO contacts 807 facilitate electrical, physical, and thermal connectivity between the SoC dies (703, 705) and contact areas of a first surface of the system substrate 701.

Once the SoC dies (703, 705) are electrically coupled to the system substrate 701, the first thermal interface material 111 may be formed as a ring over a surface of the system substrate 701 encircling the connections between the InFO contacts 807 and the contact areas of the first side of the system substrate 701. According to some embodiments, the first interface material 111 may be formed over the system substrate 701 to a thickness $T_{811}$ of between about 0.05 mm and about 0.2 mm, such as about 0.1 mm and may be formed to a ring width $W_{811}$ of between about 2 mm and about 10 mm, such as about 3 mm. An optional underfill 110 may be formed of one or more same materials using one or more same methods of deposition as used to provide the underfill 110 under the interposer 107, as described above.

Once the first and second SoC dies (703, 705) are electrically coupled to the system substrate 701, the second thermal interface material 113 may also be formed as a layer over the first and second SoC dies (703, 705) and surfaces of the molding compound 707. In some embodiments, the second thermal material 113 may be formed over the first and second SoC dies (703, 705) to a thickness $T_{813}$ of between about 0.03 mm and about 0.15 mm, such as about 0.06 mm.

Once the first thermal interface material 111 and the second thermal interface material 113 have been deposited, the integrated InFO oS VC-Lid 731 may be arranged over and pressed in contact with the first thermal interface material 111 and the second thermal interface material 113 to physically and thermally connect the integrated InFO oS VC-Lid 731 to the surfaces of the SoC dies (703, 705) and to the system substrate 701. As such, the integrated InFO oS VC-Lid 731 serves to transfer heat via the first and second thermal interfaces materials (111, 113) through the heat input area 141 to the heat rejection area 142 of the integrated InFO oS VC-Lid 731, as illustrated in detail FIG. 1B with regard to VC-Lid 131.

The integrated InFO oS VC-Lid 731 may be constructed and function according to any of the embodiments disclosed herein with regard to the other figures; however, the integrated InFO oS VC-Lid 731 may have a size suitable for packaging the plurality of SoC dies (703, 705) of the InFO oS package 700. For example, the integrated InFO oS VC-Lid 731 may comprise a vapor chamber 135 that spans the entire width $W_{731}$ of the InFO oS package 700 similar to the VC-Lid 131 illustrated in FIGS. 1A and 1B. The integrated InFO oS VC-Lid 731 may be suitable for being physically and thermally coupled to one or more of a heat sink, a vapor chamber heat sink and/or a metal sheet similar to the heat sink 201, the VC-HS 331 and/or the metal sheet 401 as illustrated in FIGS. 2-4. The integrated InFO oS VC-Lid 731 may comprise an embedded vapor chamber lid that spans only a portion of the width $W_{731}$ of the InFO oS package 700 and is arranged over one or more of the SoC dies (703, 705) and is supported by a VC-frame portion similar to the VC-Lid 531 and VC-frame 535 illustrated in FIG. 5.

External package contacts 815 may be formed to the second surface of the 701 using any suitable contact and any suitable method to form the external package contacts 815. In some embodiments, the external package contacts 815 may be formed as a ball grid array (BGA) of the InFO oS package 700. The external package contacts 815 may be contact bumps comprising a material such as tin, silver, lead-free tin, or copper and may be formed using any suitable method, such as, evaporation, electroplating, printing, solder transfer, ball placement, etc., to a thickness of, e.g., about 440 μm, according to some embodiments. Once a layer of tin has been formed on the structure, a reflow may be performed in order to shape the material into the desired bump shape.

Figure 9:
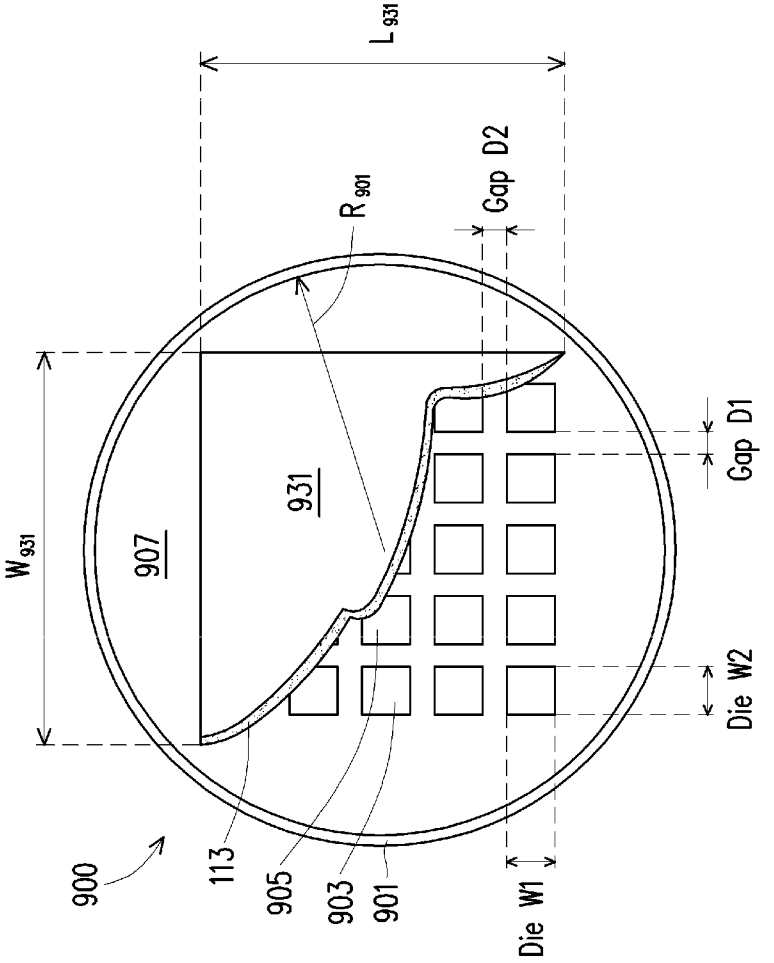
FIGS. 9-10 illustrate a system on wafer package with an integrated system on wafer vapor chamber lid in accordance with some embodiments.

FIG. 9 is an overhead view illustrating a system on wafer (SoW) package 900 with an integrated SoW vapor chamber Lid (VC-Lid) 931, according to some embodiments. The integrated SoW 931 is illustrated in “cut-away” form in order to better illustrate the components of the SoW package 900. The SoW package 900 comprises a plurality of system on chip (SoC) dies (e.g., a first SoC die 903 and a second SoC die 905) that are arranged and bonded to the surface of a support wafer 901. For example, the first and second SoC dies (903, 905) are formed on another wafer and then tested. Once tested, the dies which pass through testing may be singulated from the wafer and arranged on the support wafer 901 as “known good dies.”

The support wafer 901 may be formed of a same material as one or more of the system substrate 701 and the 3D-IC PKG substrate 103, as described above or may be any suitable substrate for use in packaging a plurality of SoC dies. In an embodiment, the radius $R_{901}$ of the support wafer 901 may be between about 100 mm and about 225 mm, such as about 150 mm. The first plurality of SoC dies 903 may be, for example, a plurality of first 3D-IC processing dies (e.g., a first plurality of 3D-IC modules 105) and the second plurality of SoC dies 905 may be, for example, a second plurality of 3D-IC processing dies (e.g., a second plurality of 3D-IC modules 105). However, the first plurality of SoC dies 903 and the second plurality of SoC dies 905 may be any suitable plurality of semiconductor dies.

In some embodiments, the plurality of SoC dies 903 and the plurality of second SoC dies 905 may be arranged in an array of adjacent dies including a series of rows and a series of columns of the plurality of SoC dies (903, 905) with one or more columns of the first plurality of SoC dies 903 being arranged adjacent one or more columns of the second plurality of SoC dies 905. However, any suitable combination and any suitable arrangement of the first plurality of SoC dies 903 and the second plurality of SoC dies 905 may be utilized. In some embodiments, the first plurality of SoC dies 903 and the second plurality of SoC dies 905 may have a first die width Die W1 of between about 10 mm and about 30 mm, such as about 25 mm and a second die width Die W2 of between about 10 mm and about 30 mm, such as about 25 mm. According to some embodiments, the array of adjacent dies may have a first die to die gap Gap D1 of between about 4 mm and about 15 mm, such as about 5 mm and a second die gap Gap D2 of between about 4 mm and about 15 mm, such as about 5 mm. However any suitable die widths may be utilized for the first die width Die W1 and the second die width Die W2 and any suitable die gaps may be utilized for the first die gap Gap D1 and the second die gap Gap D2.

Once arranged, the plurality of first and second SoC dies (903, 905) may be embedded in the molding compound 707 and subsequently planarized (e.g., via a chemical mechanical planarization (CMP) method) to expose the backside surfaces of the SoC dies (903, 905) through the molding compound 907. Once exposed, a layer of the thermal interface material 113 may be deposited over and in contact with the exposed backside surfaces of the array of the first and second SoC dies (903, 905). Once deposited, the thermal interface material 113 may serve to physically and thermally couple the integrated SoW VC-Lid 931 to the backside surfaces of the plurality of SoC dies (703, 705), according to some embodiments.

The integrated SoW VC-Lid 931 may have a width $W_{931}$ of between about 100 mm and about 200 mm, such as about 150 mm and may have a length $L_{931}$ of between about 100 mm and about 200 mm, such as about 150 mm, according to some embodiments. However, any suitable width and any suitable length may be used for the width $W_{931}$ and length $L_{931}$ of the integrated SoW VC-Lid 931.

Figure 10:
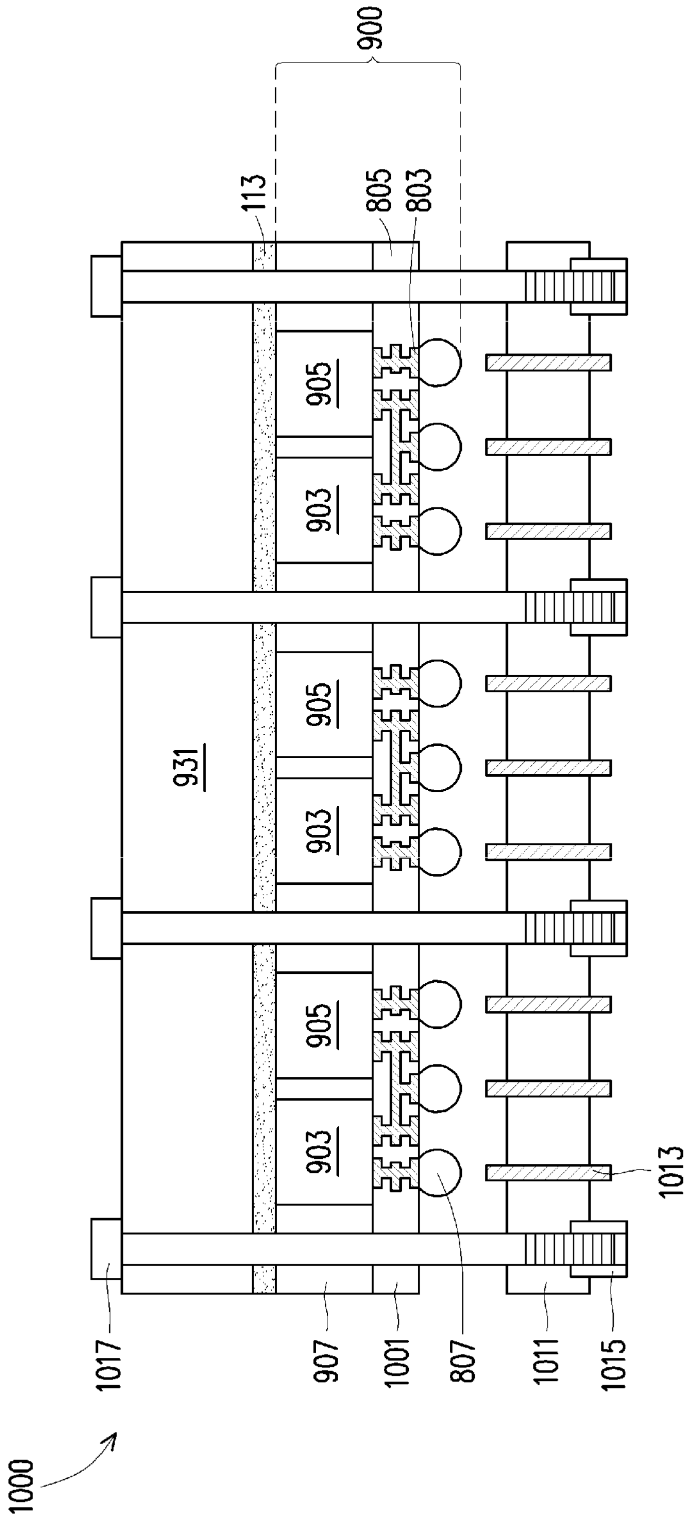

FIG. 10 is a cross-sectional view illustrating a SoW package 1000 including the SoW package 900 of FIG. 9 after removal from the system substrate 901 and attachment of the singulated SoW package 900 to a socket module 1011 via fasteners 1017. FIG. 10 further illustrates a wafer level redistribution layer (RDL) 1001 formed between the array of first and second SoC dies (903, 905) a plurality of the external InFO contacts 807 on an opposite side of the wafer level RDL 1001.

Once the array of first and second SoC dies (903, 905) are arranged and embedded in the molding compound 907, the wafer level RDL 1001 may be formed over contact areas of the first and second SoC dies (903, 905). The wafer level RDL 1001 comprises a series stack of alternating layers of the series of conductive layers 803 and the series of dielectric layers 805 electrically coupling one or more of the plurality of system on chip (SoC) dies (903, 905) on a first side of the wafer level RDL 1001 to one or more of the external InFO contacts 807 on a second side of the wafer level RDL 1001. In some embodiments, the wafer level RDL 1001 spans the entire width of the SoW package 900.

In some embodiments, the wafer level RDL 1001 may be formed prior to the mounting of the integrated SoW VC-Lid 931. In other embodiments, the integrated SoW VC-Lid 931 may be mounted prior to forming the wafer level RDL 1001. Once the wafer level RDL 1001 has been formed and the integrated SoW VC-Lid 931 has been mounted, the SoW package 900 may be attached to the socket module 1011 using the fasteners 1017. The socket module 1011 includes a plurality of external connections 1013, which in some embodiments may be pins such as pogo pins including ground pins and signal pins, and which may be used, for example, to probe one or more devices under test (DUT). In some embodiments, the fasteners 1017 may be, for example, screws that extend through the body of the singulated SoW package 900 to threaded spacers 1015 of the socket module 1011. As such, the heads of the fastener 1017 pull the integrated SoW VC-Lid 931 in contact with the thermal interface material 113 towards the socket module 1011 as the fasteners 1017 are tightened, for example, by rotation of the threaded ends of the fasteners 1017 within the threaded spacers 1015 of the socket module 1011. Although the fasteners 1017 are characterized as screws in FIG. 10, any suitable fasteners (e.g., clamps) may be used to attach the singulated SoW package 900 to the socket module 1011.

Figure 11:
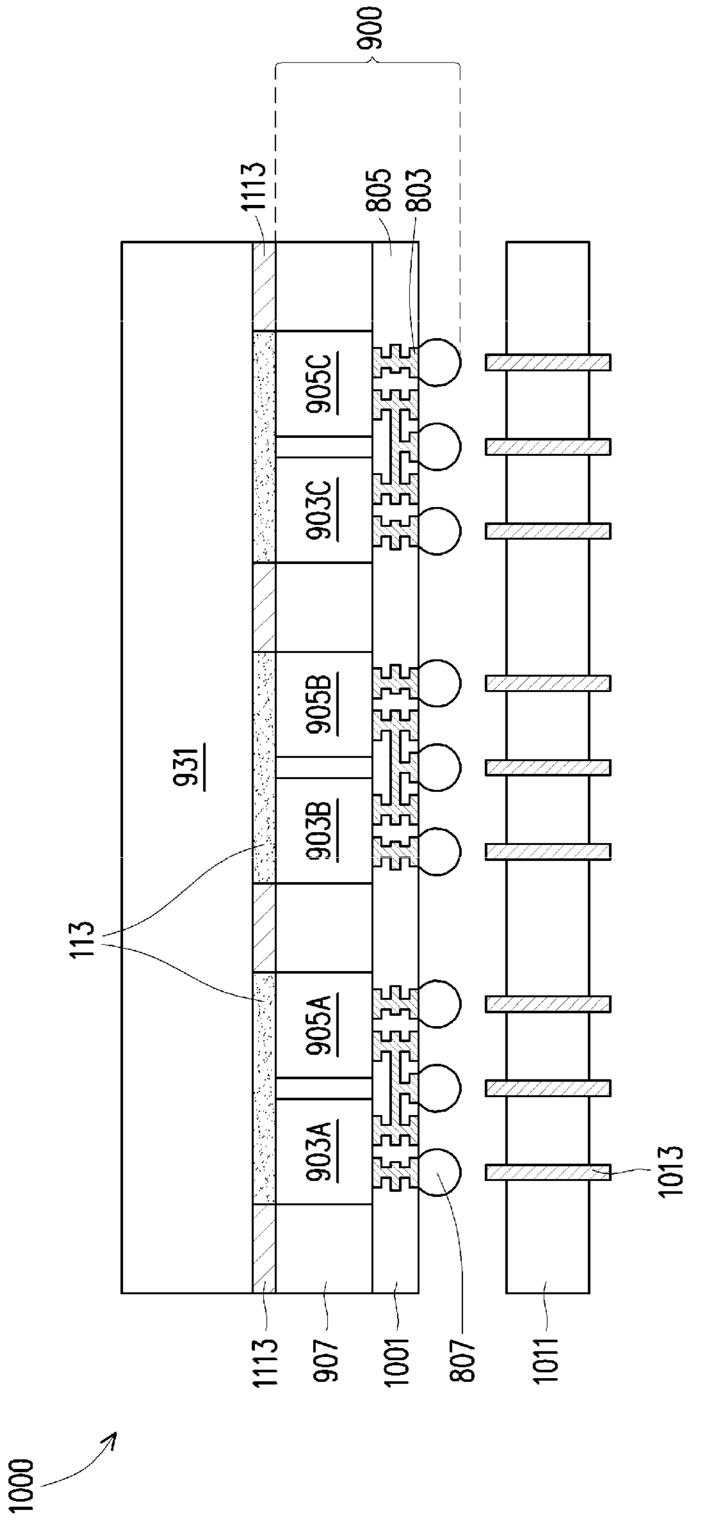
FIGS. 11-12 illustrate system on wafer packages with thermal interface material interspersed with adhesive materials in accordance with some embodiments.

FIG. 11 illustrates an embodiment of the SoW package 1000 with the SoW package 900 disposed between the SoW VC-Lid 931 and the socket module 1011 (with fasteners 1017 hidden for clarity of the following discussion). FIG. 11 illustrates the thermal interface material 113 and an adhesive layer 1113 for thermally coupling the SoW VC-Lid 931 to the surface of the singulated SoW package 900. As illustrated in FIG. 11 and according to some embodiments, portions of the thermal interface material 113 are disposed between and thermally couples a plurality of "hot spots" (e.g., each pair of SoC dies (903A, 905A; 903B, 905B; and 903C, 905C)) of the singulated SoW package 900 to the SoW VC-Lid 931. Also illustrated in FIG. 11, are a plurality of portions of the adhesive layer 1113 on portions of the molding compound 907 and separating the portions of the thermal interface material 113. The plurality of portions of the adhesive layer 1113 are disposed between the molding compound 907 and the SoW VC-Lid 931, thereby securing the SoW VC-Lid 931 to the surface of the singulated SoW package 900.

Figure 12:
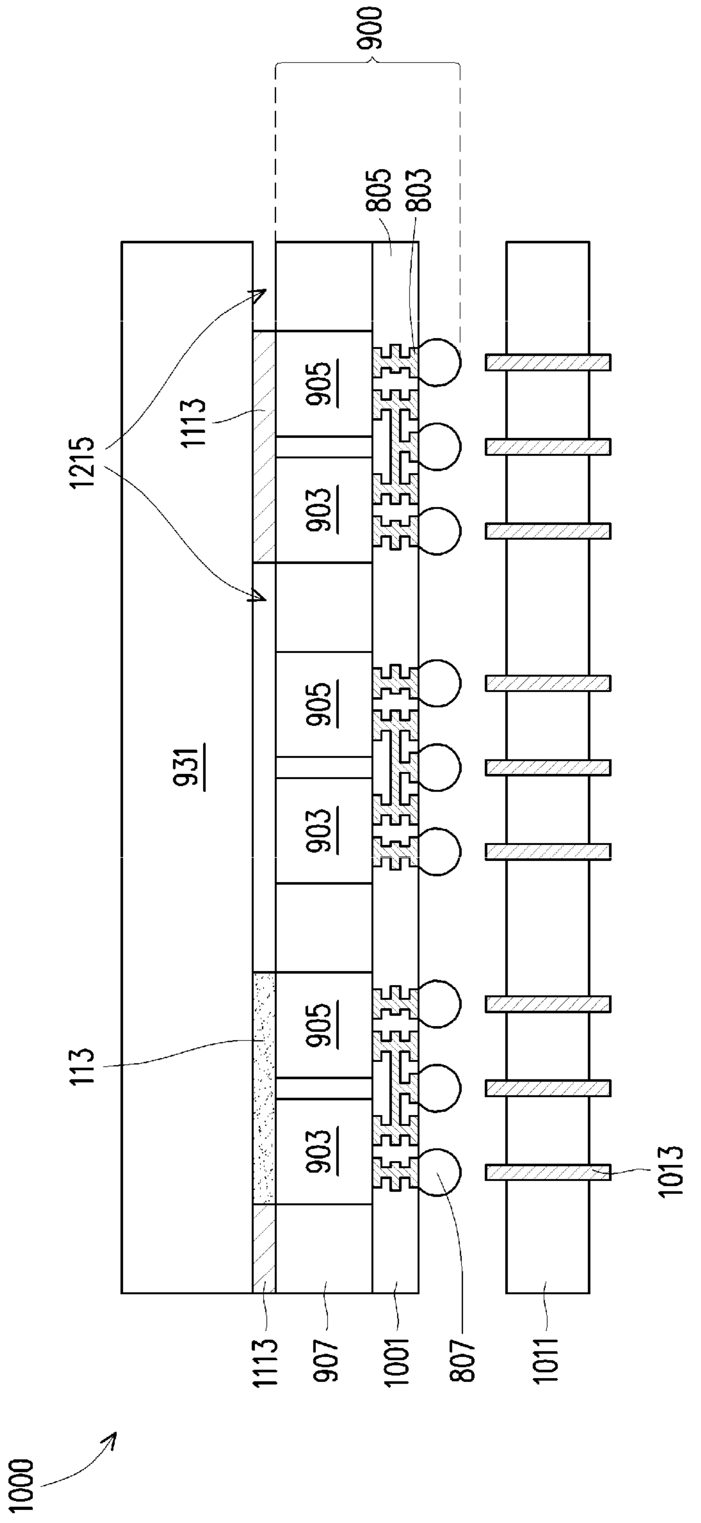

FIG. 12 illustrates an embodiment of the SoW package 1000 with the SoW package 900 disposed between the SoW VC-Lid 931 and the socket module 1011 (with fasteners 1017 hidden for clarity of the following discussion). FIG. 12 further illustrates the thermal interface material 113 and the adhesive layer 1113 for thermally and physically coupling the SoW VC-Lid 931 to the surface of the singulated SoW package 900. As illustrated in FIG. 12 and according to some embodiments, a first portion of the thermal interface material 113 is disposed between and thermally couples a "hot spot" (e.g., a pair of SoC dies (903A, 905A)) of the singulated SoW package 900 to the SoW VC-Lid 931. Gaps 1215 are illustrated in FIG. 12 between a second pair of SoC dies (903B, 905B) of the singulated SoW package 900 and the SoW VC-Lid 931 and between an outer portion of the molding compound 907 and the SoW VC-Lid 931. A first portion of the adhesive layer 1113 is disposed between an outer portion of the molding compound 907 and the SoW VC-Lid 931. A second portion of the adhesive layer 1113 separates the gaps 1215 and is disposed between a third pair of SoC dies (903C, 905C) of the singulated SoW package 900 and the SoW VC-Lid 931.

Figure 13:
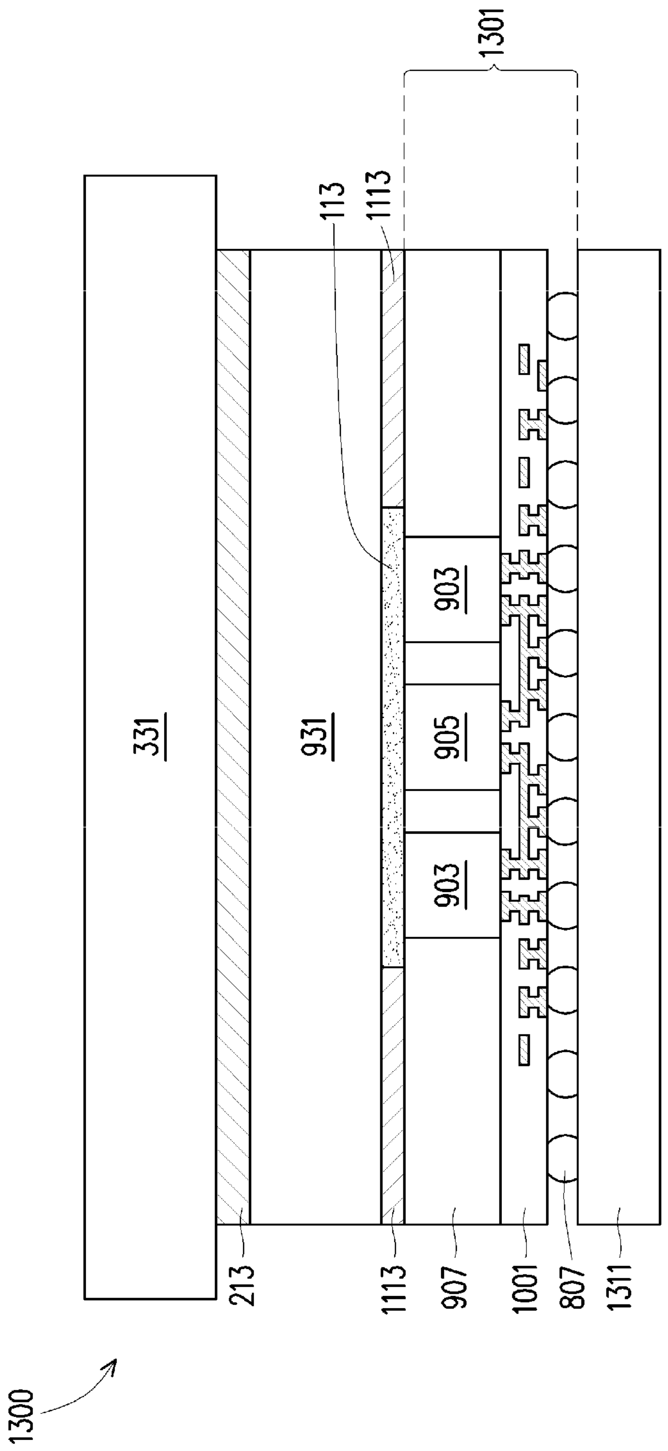
FIG. 13 illustrates a system on wafer package with a vapor chamber heat sink in accordance with some embodiments.

FIG. 13 is a cross-sectional view illustrating an embodiment of a SoW package 1300 including a SoW package 1301 disposed and thermally connected between a PC board (PCB) 1311 and the SoW VC-Lid 931. FIG. 13 further illustrates the vapor chamber heat sink (VC-HS) 331 being thermally coupled to the SoW VC-Lid 931 via the fourth thermal interface material 213.

According to some embodiments, as illustrated in FIG. 13, the external contacts 807 of the SoW package 1301 are bonded to contact areas of the PCB 1311 (e.g., via a solder reflow process). In FIG. 13, the thermal interface material 113 is disposed over and thermally couples the plurality of SoC dies (903, 905) of the singulated SoW package 1301 to the SoW VC-Lid 931, according to some embodiments. As further illustrated in FIG. 13 and according to some embodiments, a portion of an adhesive layer 1113 is disposed between outer portions of the molding compound 907 of the SoW package 1301 and the SoW VC-Lid 931. According to some embodiments, the adhesive layer 1113 may thermally couple the portion of the surface of the singulated SoW package 1301 to the SoW VC-Lid 931.

In an embodiment, a method includes arranging a multi-die stacked semiconductor device on a substrate; and placing a vapor chamber lid over the multi-die stacked semiconductor device with a heat input area of a first surface of the vapor chamber lid being thermally coupled to a surface of the multi-die stacked semiconductor device. In an embodiment, the method further includes disposing a first thermal interface material over the multi-die stacked semiconductor device and between the surface of the multi-die stacked semiconductor device and the heat input area of the first surface of the vapor chamber lid. In an embodiment, the method further includes arranging a heat sink over the vapor chamber lid with a contact area of a first surface of the heat sink being thermally coupled to a heat rejection area of a second surface of the vapor chamber lid. In an embodiment, the method further includes disposing a second thermal interface material over the vapor chamber lid and between the heat rejection area of the second surface of the vapor chamber lid and the contact area of the first surface of the heat sink. In an embodiment, the method further includes arranging a vapor chamber heat sink over the vapor chamber lid with a contact area of a first surface of the vapor chamber heat sink being thermally coupled to a heat rejection area of a second surface of the vapor chamber lid. In an embodiment, the method further includes disposing a second thermal interface material over the vapor chamber lid and between the heat rejection area of the second surface of the vapor chamber lid and the contact area of the first surface of the vapor chamber heat sink. In an embodiment, the method further including arranging a heat sink over the vapor chamber heat sink with a contact area of a first surface of the heat sink being thermally coupled to a heat rejection area of a second surface of the vapor chamber heat sink; and disposing a third thermal interface material over the vapor chamber heat sink and between the heat rejection area of the second surface of the vapor chamber lid and the contact area of the first surface of the vapor chamber heat sink.

In an embodiment, a method includes bonding a three-dimensional integrated circuits (3D-IC) module to a substrate; and arranging a vapor chamber heat spreader over the 3D-IC module with a heat intake area of a first surface of the vapor chamber heat spreader being thermally coupled to a surface of the 3D-IC module. In an embodiment, the method further includes arranging a vapor chamber lid (VC-Lid) over a first portion of the 3D-IC module. In an embodiment, the method further includes determining a location of a hot spot of the 3D-IC module; and placing the VC-Lid over the first portion of the 3D-IC corresponding to the location of the hot spot. In an embodiment, the method further includes arranging a vapor chamber heat sink (VC-HS) over the 3D-IC module, the VC-HS including the heat intake area in a first portion of a first surface of the VC-HS, the VC-HS having a width that is greater than a width of the substrate. In an embodiment, the method further includes forming a thermally conductive ring on the substrate with inner walls of the thermally conductive ring facing and spaced apart from outer sidewalls of the 3D-IC module. In an embodiment, the method further includes arranging overlying portions of the first surface of the VC-HS over the thermally conductive ring, the overlying portions facing and being separated from uppermost surfaces of the thermally conductive ring by a gap. In an embodiment, the 3D-IC module includes a 3D-IC processor and one or more 3D-IC memory dies. In an embodiment, the method further includes bonding a conductive sheet to a second surface of the vapor chamber heat spreader, the second surface being opposite the first surface of the vapor chamber heat spreader.

In an embodiment, a semiconductor device includes a substrate; a three dimensional multi-die stacked package electrically coupled to the substrate; and a vapor chamber cap including a heat absorption area on a first side of the vapor chamber cap and a heat expulsion area on a second side of the vapor chamber cap opposite the first side, the heat absorption area of the vapor chamber cap being thermally coupled to a surface of the three dimensional multi-die stacked package. In an embodiment, the semiconductor device further includes further includes a heat sink disposed over the vapor chamber cap with a contact area of a first surface of the heat sink being thermally coupled to a heat expulsion area of a second surface of the vapor chamber cap. In an embodiment, the semiconductor device further includes a first thermal interface material disposed over the three dimensional multi-die stacked package and between the surface of the three dimensional multi-die stacked package and the heat absorption area on the first surface of the vapor chamber cap. In an embodiment, the semiconductor device further includes a vapor chamber heat sink disposed over the vapor chamber cap with a contact area of a first surface of the vapor chamber heat sink being thermally coupled to a heat expulsion area of a second surface of the vapor chamber cap. In an embodiment, the semiconductor device further includes a vapor chamber heat sink disposed over the vapor chamber cap with a contact area of a first surface of the vapor chamber heat sink being thermally coupled to a heat expulsion area of a second surface of the vapor chamber cap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:

placing a vapor chamber lid over a semiconductor device and a substrate, wherein the vapor chamber lid comprises a chamber with vapor inside of the chamber and has a first planar surface facing the semiconductor device and has a second planar surface facing away from the semiconductor device, the first planar surface and the second planar surface each extending from a first side of the vapor chamber lid to a second side of the vapor chamber lid opposite the first side, wherein the first side and the second side are parallel to each other and perpendicular to the first planar surface and the second planar surface, wherein the first side intersects with both the first planar surface and the second planar surface, wherein the first side and the second side are perpendicular to the first planar surface; and placing a thermally conductive ring on the substrate, wherein the placing the vapor chamber lid further comprises arranging at least part of the vapor chamber lid over the thermally conductive ring, overlying portions facing and being separated from uppermost surfaces of the thermally conductive ring by a gap, wherein the ring is aligned with both the first side and the second side.

2. The method of claim 1, wherein the semiconductor device comprises:

an interposer;

a first semiconductor die bonded to the interposer; and a second semiconductor die bonded to the interposer.

3. The method of claim 2, wherein the thermally conductive ring is located between about 2 mm and about 20 mm from the interposer.

4. The method of claim 1, wherein the thermally conductive ring has a thickness of between about 0.5 mm and about 3 mm.

5. The method of claim 1, wherein the substrate has a height of between about 1 mm and about 3 mm.

6. The method of claim 5, wherein the substrate has a width of between about 30 mm and about 100 mm.

7. The method of claim 1, wherein the thermally conductive ring comprises aluminum.

8. A method of manufacturing a semiconductor device, the method comprising:

bonding a first semiconductor die and a second semiconductor die to an interposer;

bonding the interposer to a substrate;

placing a ring on the substrate; and placing a vapor chamber heat spreader over the first semiconductor die, the second semiconductor die, and the ring, wherein a gap is located between the ring and the vapor chamber heat spreader, wherein the vapor chamber heat spreader comprises a phase change material enclosed within a chamber, wherein the vapor chamber heat spreader has a first surface facing the substrate and extending from a first side of the vapor chamber heat spreader to a second side of the vapor chamber heat spreader, wherein each portion of the first surface is a same distance from the interposer, wherein the first side and the second side are perpendicular to the first surface and wherein the first side and the second side are located aligned with the ring.

9. The method of claim 8, further comprising attaching a heat sink to the vapor chamber heat spreader.

10. The method of claim 9, wherein the attaching the heat sink utilizes a thermal interface material.

11. The method of claim 8, wherein the vapor chamber heat spreader has a width that is larger than a width of the substrate.

12. The method of claim 8, wherein the gap has a height of between about 0.03 mm and about 0.2 mm.

13. The method of claim 8, wherein the gap has a height of between about 0.03 mm and about 0.05 mm.

14. The method of claim 8, wherein a cavity is located between the ring and the interposer.

15. A method of manufacturing a semiconductor device, the method comprising:

bonding a three dimensional multi-die package to a substrate;

placing a ring onto the substrate;

placing a vapor chamber cap in thermal connection with the three dimensional multi-die package, wherein after the placing the vapor chamber cap a region located directly between a surface of the ring facing the vapor chamber cap and the vapor chamber cap is free from material, the vapor chamber cap comprising a chamber that encloses a vapor and a wick, wherein each portion of the vapor chamber cap remains further away from the substrate than the ring, wherein the vapor chamber cap comprises four outermost surfaces, at least two of the outermost surfaces being aligned with the ring; and placing a heat sink over the vapor chamber cap.

16. The method of claim 15, wherein the region has a height of between about 0.03 mm and about 0.2 mm.

17. The method of claim 15, wherein the region has a height of between about 0.03 mm and about 0.05 mm.

18. The method of claim 15, wherein the vapor chamber cap has a first width larger than a second width of the substrate.

19. The method of claim 15, wherein after the placing the ring a sheet of indium is located between the ring and the substrate.

20. The method of claim 15, wherein after the placing the ring a sheet of nickel is located between the ring and the substrate.

* * * * *